United States Patent
Yamazaki et al.

(10) Patent No.: US 8,530,332 B2
(45) Date of Patent: Sep. 10, 2013

(54) METHOD FOR MANUFACTURING SOI SUBSTRATE AND SEMICONDUCTOR DEVICE

(75) Inventors: Shunpei Yamazaki, Setagaya (JP); Eriko Nishida, Atsugi (JP); Takashi Shimazu, Machida (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 396 days.

(21) Appl. No.: 12/410,649

(22) Filed: Mar. 25, 2009

(65) Prior Publication Data

US 2009/0261449 A1 Oct. 22, 2009

(30) Foreign Application Priority Data

Mar. 26, 2008 (JP) ................. 2008-079592

(51) Int. Cl.
*H01L 21/30* (2006.01)
*H01L 21/46* (2006.01)

(52) U.S. Cl.
USPC .... 438/458; 438/455; 438/459; 257/E21.568; 257/E21.545

(58) Field of Classification Search
USPC ................. 438/455, 458, 459; 257/E21.568, 257/E21.545
See application file for complete search history.

(56) References Cited

U.S. PATENT DOCUMENTS 5,374,564 A 12/1994 Bruel
5,949,115 A * 9/1999 Yamazaki et al. ............ 257/396

(Continued)

FOREIGN PATENT DOCUMENTS

JP 02-054532 2/1990
JP 05-211128 8/1993

(Continued)

OTHER PUBLICATIONS

Lu et al., "Plasma Immersion Ion Implantation for SOI Synthesis: SIMOX and Ion-Cut", 1998, Journal of Electronic Materials, vol. 27, No. 9, pp. 1059-1066.*

(Continued)

*Primary Examiner* — Leonard Chang
(74) *Attorney, Agent, or Firm* — Eric J. Robinson; Robinson Intellectual Property Law Office, P.C.

(57) ABSTRACT

An object is to provide an SOI substrate with excellent characteristics even in the case where a single crystal semiconductor substrate having crystal defects is used. Another object is to provide a semiconductor device using such an SOI substrate. A single crystal semiconductor layer is formed by an epitaxial growth method over a surface of a single crystal semiconductor substrate. The single crystal semiconductor layer is subjected to first thermal oxidation treatment to form a first oxide film. A surface of the first oxide film is irradiated with ions, whereby the ions are introduced to the single crystal semiconductor layer. The single crystal semiconductor layer and a base substrate are bonded with the first oxide film interposed therebetween. The single crystal semiconductor layer is divided at a region where the ions are introduced by performing thermal treatment, so that the single crystal semiconductor layer is partly left over the base substrate. The single crystal semiconductor layer left over the base substrate is irradiated with laser light. The single crystal semiconductor layer left over the base substrate is subjected to second thermal oxidation treatment to form a second oxide film. Then, the second oxide film is removed.

25 Claims, 19 Drawing Sheets

(56) References Cited

U.S. PATENT DOCUMENTS

| | | | |
|---|---|---|---|
| 5,970,366 A * | 10/1999 | Okonogi | 438/471 |
| 6,271,101 B1 | 8/2001 | Fukunaga | |
| 6,335,231 B1 * | 1/2002 | Yamazaki et al. | 438/151 |
| 6,337,259 B1 * | 1/2002 | Ueda et al. | 438/471 |
| 6,372,609 B1 | 4/2002 | Aga et al. | |
| 6,380,046 B1 | 4/2002 | Yamazaki | |
| 6,534,380 B1 | 3/2003 | Yamauchi et al. | |
| 6,602,761 B2 | 8/2003 | Fukunaga | |
| 6,777,713 B2 | 8/2004 | Miyairi et al. | |
| 6,803,264 B2 | 10/2004 | Yamazaki et al. | |
| 6,803,296 B2 | 10/2004 | Miyairi | |
| 6,875,633 B2 | 4/2005 | Fukunaga | |
| 6,927,148 B2 | 8/2005 | Ito | |
| 7,008,860 B2 | 3/2006 | Kakizaki et al. | |
| 7,129,123 B2 | 10/2006 | Sakurada et al. | |
| RE39,484 E | 2/2007 | Bruel | |
| 7,199,024 B2 | 4/2007 | Yamazaki | |
| 7,199,027 B2 | 4/2007 | Ichijo et al. | |
| 7,232,488 B2 | 6/2007 | Akatsu et al. | |
| 7,276,427 B2 | 10/2007 | Ichikawa et al. | |
| 7,348,222 B2 | 3/2008 | Shimomura et al. | |
| 7,473,592 B2 | 1/2009 | Yamazaki et al. | |
| 7,476,576 B2 | 1/2009 | Yamazaki et al. | |
| 7,579,654 B2 * | 8/2009 | Couillard et al. | 257/347 |
| 7,755,113 B2 * | 7/2010 | Yamazaki et al. | 257/257 |
| 7,767,547 B2 | 8/2010 | Isaka et al. | |
| 7,781,308 B2 | 8/2010 | Isaka et al. | |
| 7,795,114 B2 | 9/2010 | Moriwaka | |
| 7,910,457 B2 * | 3/2011 | Yamazaki | 438/458 |
| 8,236,668 B2 * | 8/2012 | Ohnuma et al. | 438/458 |
| 2001/0046746 A1 * | 11/2001 | Yokokawa et al. | 438/311 |
| 2002/0109144 A1 | 8/2002 | Yamazaki | |
| 2003/0232466 A1 | 12/2003 | Zistl et al. | |
| 2004/0192067 A1 | 9/2004 | Ghyselen et al. | |
| 2007/0087458 A1 * | 4/2007 | Tanaka et al. | 438/22 |
| 2007/0173000 A1 | 7/2007 | Yamazaki | |
| 2007/0287269 A1 * | 12/2007 | Yokokawa et al. | 438/478 |
| 2008/0061301 A1 | 3/2008 | Yamazaki | |
| 2008/0067529 A1 | 3/2008 | Yamazaki | |
| 2008/0067597 A1 | 3/2008 | Yamazaki | |
| 2008/0083953 A1 | 4/2008 | Yamazaki | |
| 2008/0213953 A1 | 9/2008 | Yamazaki | |
| 2008/0246109 A1 | 10/2008 | Ohnuma et al. | |
| 2008/0261376 A1 | 10/2008 | Yamazaki et al. | |
| 2008/0261379 A1 | 10/2008 | Jinbo et al. | |
| 2008/0268263 A1 | 10/2008 | Yamazaki | |
| 2008/0280420 A1 | 11/2008 | Yamazaki | |
| 2008/0286911 A1 | 11/2008 | Miyairi | |
| 2008/0286941 A1 | 11/2008 | Yamazaki | |
| 2008/0286942 A1 | 11/2008 | Yamazaki | |
| 2008/0286952 A1 | 11/2008 | Miyairi et al. | |
| 2008/0286956 A1 | 11/2008 | Yamazaki | |
| 2008/0299743 A1 | 12/2008 | Miyairi | |
| 2008/0311709 A1 | 12/2008 | Ohnuma | |
| 2009/0115028 A1 | 5/2009 | Shimomura et al. | |
| 2009/0142879 A1 | 6/2009 | Isaka et al. | |
| 2009/0142908 A1 | 6/2009 | Isaka et al. | |
| 2009/0197391 A1 | 8/2009 | Ohnuma et al. | |
| 2009/0246934 A1 | 10/2009 | Yamazaki et al. | |
| 2009/0246936 A1 | 10/2009 | Yamazaki et al. | |
| 2009/0246937 A1 | 10/2009 | Yamazaki et al. | |
| 2010/0047952 A1 | 2/2010 | Ohnuma et al. | |

FOREIGN PATENT DOCUMENTS

| | | |
|---|---|---|
| JP | 09-260619 | 10/1997 |
| JP | 2000-012864 | 1/2000 |
| JP | 2000-030993 | 1/2000 |
| JP | 2000-294754 | 10/2000 |
| JP | 2005-252244 | 9/2005 |

OTHER PUBLICATIONS

Zehner, D. et al., "Preparation of Atomically Clean Silicon Surfaces by Pulsed Laser Irradiation," Appl. Phys. Lett. (Applied Physics Letters), Jan. 1, 1980, vol. 36, No. 1, pp. 56-59.

* cited by examiner

FIG. 15

| acceleration voltage | Hydrogen atom (H) ratio (X:Y) | Hydrogen ion ratio (X:Y/3) |
|---|---|---|
| 80kV | 1:44.1 | 1:14.7 |
| 60kV | 1:42.5 | 1:14.2 |
| 40kV | 1:43.5 | 1:14.5 |

METHOD FOR MANUFACTURING SOI SUBSTRATE AND SEMICONDUCTOR DEVICE

BACKGROUND OF THE INVENTION

1. Field of the Invention

The present invention relates to a method for manufacturing an SOI substrate which has a semiconductor layer formed over an insulating film and a semiconductor device using the SOI substrate.

2. Description of the Related Art

In recent years, instead of a bulk silicon wafer, integrated circuits using an SOI (silicon on insulator) substrate have been developed. By utilizing characteristics of a single crystal silicon thin film formed over an insulating film, semiconductor layers of transistors formed in the integrated circuit can be separated from each other completely. Further, since the fully-depleted transistors can be formed, a semiconductor integrated circuit with high added value such as high integration, high speed driving, and low power consumption can be realized.

Known examples of SOI substrates are SIMOX substrates and bonded substrates. For example, an SOI structure of a SIMOX substrate is obtained in such a manner that oxygen ions are implanted into a silicon wafer and thermal treatment is performed at 1300° C. or higher to form a buried oxide (BOX) layer, so that a single crystal silicon thin film is formed on the surface of the substrate.

In the case of a bonded substrate, an SOI structure is obtained in such a manner that two silicon wafers (a base substrate and a bond substrate) are bonded to each other with an oxide film interposed therebetween, and one of the silicon wafers (the bond substrate) is thinned by grinding and/or polishing on its rear side (the side which is not a surface bonded), so that a silicon thin film is formed. Meanwhile, there is proposed a technique called an ion implantation separation method which employs hydrogen ion implantation (e.g., Reference 1: Japanese Published Patent Application No. H5-211128), because it is difficult to form a uniform silicon thin film by grinding or polishing. The ion implantation separation method is also called a Smart Cut (registered trademark).

Hereinafter, an outline of the ion implantation separation method will be described. First, hydrogen ions are implanted into a silicon wafer by an ion implantation method, so that an embrittlement region is formed at a predetermined depth from a surface of the silicon wafer. Next, another silicon wafer which serves as a base substrate is oxidized to form a silicon oxide film. After that, the silicon wafer into which hydrogen ions are implanted is made to have contact with the silicon oxide film of the silicon wafer which serves the base substrate, so that the two silicon wafers are bonded to each other. Then, through thermal treatment, the silicon wafer is separated using the embrittlement region as a cleavage plane, thereby forming a substrate in which a thin film of single crystal silicon is bonded to the silicon wafer which serves as the base substrate.

As for an ion implantation method, particles to be implanted into a sample are ionized in vacuum and accelerated by the electric field. An ion implanter used for an ion implantation method includes an ion source, a mass separation unit, an acceleration unit, a beam scanner (electrostatic scan) unit, an implantation chamber (end-station), and an evacuation unit. Further, since a cross section of an ion beam is not uniform, scanning with an ion beam is performed on a surface of the sample in order to obtain uniformity.

One of the known examples of semiconductor devices using SOI substrates is disclosed (see Reference 2: Japanese Published Patent Application No. 2000-012864). In Reference 2, a method for manufacturing an SOI substrate, in which hydrogen is implanted by an ion implantation method and a high heat-resistance substrate is used, is disclosed.

SUMMARY OF THE INVENTION

As for manufacture of the above SOI substrate, a silicon wafer manufactured by a Czochralski (CZ) method is generally utilized. The silicon wafer manufactured by the CZ method has defects such as COPs (crystal originated particles) or FPDs (flow pattern particles) formed at the time of crystal growth. Such crystal defects cause defects produced in a wafer processing process, an SOI substrate manufacturing process, a semiconductor device manufacturing process, and the like.

Accordingly, when an SOI substrate is manufactured using such a silicon wafer having crystal defects, defects are increased in a process; thus, it is difficult to obtain an SOI substrate with excellent characteristics. Further, defects in the SOI substrate greatly affect characteristics of a semiconductor device.

A silicon wafer from which a single crystal silicon thin film is separated can be reused. However, defects caused by separation of the single crystal silicon thin film are generated in the silicon wafer or on a surface of the silicon wafer after separation, and there is a problem in that it is difficult to obtain an SOI substrate with excellent characteristics by using the silicon wafer after separation.

Thus, it is an object to provide an SOI substrate with excellent characteristics even when a single crystal semiconductor substrate having crystal defects is used. It is another object to manufacture a semiconductor device using such an SOI substrate.

In a method for manufacturing an SOI substrate according to one embodiment of the invention disclosed in this specification, a single crystal semiconductor layer having extremely few defects is formed by an epitaxial growth method, thermal oxidation treatment is performed on the single crystal semiconductor layer to form an oxide film, and ions are introduced into the single crystal semiconductor layer through the oxide film. Further, a single crystal semiconductor layer which is formed by bonding and separation is irradiated with laser light and subjected to planarization treatment, and then, thermal oxidation treatment is performed again. Hereinafter, a specific structure of the present invention will be described.

A method for manufacturing an SOI substrate according to one embodiment of the invention to be disclosed includes the following steps. A single crystal semiconductor layer is formed over a surface of a single crystal semiconductor substrate by an epitaxial growth method. A first oxide film is formed by performing first thermal oxidation treatment on the single crystal semiconductor layer. A surface of the first oxide film is irradiated with ions to introduce the ions into the single crystal semiconductor layer. The single crystal semiconductor layer and a base substrate are bonded with the first oxide film interposed between the single crystal semiconductor layer and the base substrate. Thermal treatment is performed to separate the single crystal semiconductor layer at a region where the ions are introduced, so that the singly crystal semiconductor layer is partly left over the base substrate. The single crystal semiconductor layer left over the base substrate is irradiated with laser light. A second oxide film is formed by performing second thermal oxidation treatment on the single crystal semiconductor layer left over the base substrate. Then, the second oxide film is removed.

In the above method, ions containing $H_3^+$ can be used as the ions with which the single crystal semiconductor layer is irradiated. Further, the first thermal oxidation treatment or the second thermal oxidation treatment is preferably performed in an atmosphere containing HCl.

In addition, after laser light irradiation, planarization treatment can be performed on the single crystal semiconductor layer left over the base substrate. This planarization treatment may be a CMP process or an etching process, for example. Note that it is more preferable to perform laser light irradiation in an inert atmosphere.

A variety of semiconductor devices can be provided with use of an SOI substrate manufactured by the above method.

Note that the term "single crystal" in described above indicates a semiconductor formed to have a crystalline structure with certain regularity, in which crystal axes are all in the same direction in any portion. That is, there may be a large number of defects or a small number of defects.

Note that the term "semiconductor device" in this specification generally indicates all types of devices which can function by utilizing semiconductor characteristics; display devices, semiconductor circuits, electronic appliances, and the like are all included in semiconductor devices.

In addition, a display device in this specification includes a liquid crystal display device, a light-emitting device (a light-emitting display device), or the like. The liquid crystal display device includes a liquid crystal element, and the light-emitting device includes a light-emitting element. The light-emitting element includes, for example, an inorganic EL (electro luminescence) element, an organic EL element, or the like.

According to the present invention, an SOI substrate in which defects of a single crystal semiconductor layer are reduced can be provided. Further, with use of an SOI substrate having excellent characteristics, a semiconductor device with excellent characteristics can be provided.

Note that in the present invention, a single crystal semiconductor layer which is formed in advance by an epitaxial growth method is used for manufacturing an SOI substrate. Thus, a semiconductor layer of the SOI substrate in the present invention can have a small thickness as compared with the case where after an SOI substrate is formed without using an epitaxial method, a thickness of a semiconductor layer of the SOI substrate is increased by an epitaxial growth method. Accordingly, more excellent semiconductor characteristics can be obtained.

BRIEF DESCRIPTION OF THE DRAWINGS

FIG. 15 is a list of ratios of fitting parameters (hydrogen atom ratios and hydrogen ion species ratios).

DETAILED DESCRIPTION OF THE INVENTION

Figure 1A:
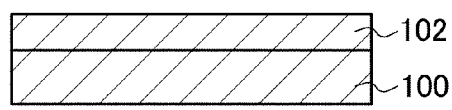
FIGS. 1A to 1H illustrate an example of a method for manufacturing an SOI substrate according to an embodiment of the present invention.

Hereinafter, embodiments will be described with reference to the accompanying drawings. However, the present invention is not limited to description of the embodiments below. It is easily understood by those skilled in the art that the mode and detail can be variously changed unless departing from the scope and spirit of the invention. A structure of the different embodiment can be implemented by combination appropriately. On the description of the invention with reference to the drawings, a reference numeral indicating the same part is used in common throughout different drawings, and the repeated description is omitted. In this specification, the semiconductor device indicates all the devices that operate by utilizing semiconductor characteristics.

Embodiment 1

In this embodiment, an example of a method for manufacturing an SOI substrate will be described with reference to drawings.

First, a single crystal semiconductor substrate 100 is prepared, and the single crystal semiconductor substrate 100 is washed as appropriate with a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), ozone water, or the like. As the single crystal semiconductor substrate 100, a single crystal silicon substrate, a germanium substrate, or a compound semiconductor substrate of gallium arsenide, indium phosphide, or the like can be used. Circular substrates which are 5 inches (125 mm) in diameter, 6 inches (150 mm) in diameter, 8 inches (200 mm) in diameter, 12 inches (300 mm) in diameter, and 18 inches (450 nm) in diameter are the typical silicon substrates. The shape of the silicon substrate is not limited to a circular shape, and a silicon substrate processed into a rectangular shape can be used. Hereinafter, the case of using a single crystal silicon substrate as the single crystal semiconductor substrate 100 is described.

Next, a single crystal semiconductor layer 102 is formed by an epitaxial growth method over the single crystal semiconductor substrate 100 (see FIG. 1A). The single crystal semiconductor layer 102 has fewer crystal defects than the single crystal semiconductor substrate 100 because the single crystal semiconductor layer 102 is formed by an epitaxial growth method. Thus, it becomes possible to suppress increase of defects in the later steps. Although there is no particular limitation on conditions of epitaxial growth, for example, in the case where a single crystal silicon layer is formed by a vapor growth method, it is preferable that the epitaxial growth be performed on such a condition that temperature is 1000° C. or higher. Further, with use of a substrate formed by adding nitrogen to the single crystal silicon substrate, a single crystal silicon layer with much fewer defects can be formed.

Note that the thickness of the single crystal semiconductor layer 102 is at least equal to or greater than 50 nm, preferably, equal to or greater than 200 nm. If the single crystal semiconductor layer 102 is extremely thin, it is more likely that the single crystal semiconductor layer 102 substantially disappears in a thermal oxidation step performed later.

Note that the thickness of the single crystal semiconductor layer 102 can be determined from another point of view. For example, the single crystal semiconductor layer 102 may have such a thickness that an embrittlement region can be formed later therein. In other words, the single crystal semiconductor layer 102 is formed to have a thickness which is larger than the depth where the embrittlement region is formed. With such a structure, it becomes possible to form an SOI substrate using only a single crystal semiconductor layer formed by epitaxial growth, which leads to improvement in characteristics of the SOI substrate.

Figure 1B:
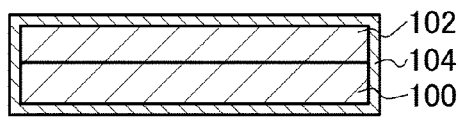

Next, the single crystal semiconductor layer 102 is subjected to thermal oxidation treatment (also referred to as first thermal oxidation treatment) to form an oxide film 104 (also referred to as a first oxide film) (see FIG. 1B). As thermal oxidation treatment, it is preferable to perform oxidation treatment in an oxidation atmosphere containing halogen. As a gas for adding halogen, one or more gases selected from HCl, HF, $NF_3$, HBr, $Cl_2$, DCE (dichloroethylene), $ClF_3$, $BCl_3$, $F_2$, or $Br_2$ can be used.

For example, in an atmosphere containing HCl at from 0.5 to 10 volume % (preferably, at from 2 to 5 volume %) with respect to oxygen, thermal treatment can be performed at a temperature of from 900 to 1150° C. (e.g., 1000° C.). The treatment time may be from 0.1 to 6 hours, preferably from 0.5 to 1 hour. The oxide film to be formed may have a thickness of from 10 to 1000 nm (preferably, from 50 to 300 nm), and for example, a thickness of 200 nm may be formed.

Note that utilizing trans-1,2-dichloroethylene is effective in low-temperature thermal oxidation treatment because the decomposition temperature of trans-1,2-dichloroethylene is low. Note that instead of trans-1,2-dichloroethylene, cis-1,2-dichloroethylene, 1,1-dichloroethylene, or a mixed gas of at least two kinds of these gases may be used for the thermal oxidation treatment.

By performing thermal treatment within such a temperature range, effect of removing impurities by halogen (e.g., chlorine) can be obtained in the single crystal semiconductor layer 102. In other words, if impurities are present in the single crystal semiconductor layer 102, the impurities turn into volatile halide (e.g., chloride) to be released to air and removed.

Further, halogen is contained in the thus obtained oxide film 104. Accordingly, impurities of the single crystal semiconductor substrate 100 and the single crystal semiconductor layer 102 can be fixed in the oxide film 104, and adverse influence on the semiconductor characteristics by diffusion of the impurities can be reduced. Here, in order to obtain the effect, it is preferable to set concentration of halogen in the oxide film 104 at about $1\times10^{16}$ to $5\times10^{21}/cm^3$.

Although a case where chlorine is used as halogen is described in this embodiment, the present invention is not limited thereto. Halogen such as fluorine may be contained in the oxide film. The formation method is not limited to the method in which thermal oxidation treatment is performed in an oxidation atmosphere containing hydrogen chloride or dichloroethylene. For example, after an oxide film which does not contain halogen substantially is formed by performing oxidation treatment in an oxidation atmosphere, chlorine ions accelerated by the electric filed are introduced into the oxide film, whereby chlorine atoms may be contained in the oxide film. Alternatively, thermal oxidation treatment may be performed in an oxidation atmosphere after the surface of the single crystal semiconductor layer is treated with hydrogen chloride (HCl).

Before the thermal oxidation treatment, chemical mechanical polishing (abbreviation: CMP) may be performed on the single crystal semiconductor layer 102. By performing CMP, planarization of the surface of the single crystal semiconductor layer 102 is improved, so that defects generated in bonding later can be reduced.

With formation of the oxide film 104 by thermal oxidation treatment, crystallinity of the single crystal semiconductor layer 102 is improved. Thus, crystal defects in the single crystal semiconductor layer 102 can be further reduced.

Figure 1C:
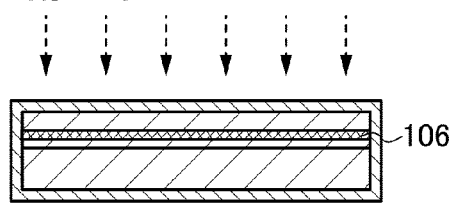

Next, the single crystal semiconductor layer 102 is irradiated with ions through the oxide film 104 to introduce the ions into the single crystal semiconductor layer 102, so that an embrittlement region 106 is formed in a region at a predetermined depth from the surface of the single crystal semiconductor layer 102 (see FIG. 1C).

The depth where the embrittlement region 106 is formed can be adjusted by the kinetic energy, incidence angles, and kind of ions, and the like. This is because the embrittlement region 106 is formed in a region at a depth the same or substantially same as the average depth where the ions enter. A thickness of a single crystal semiconductor layer which is separated later is determined depending on the depth where the embrittlement region 106 is formed. Note that the kinetic energy of the ions can be adjusted by the accelerated voltage or the like.

The embrittlement region 106 may be formed at a depth of from 10 to 500 nm from the surface of the single crystal semiconductor layer 102, and more preferably, from 50 to 200 nm. By forming the embrittlement region 106 in the single crystal semiconductor layer 102, characteristics of the SOI substrate can be improved as compared with a case where the embrittlement region 106 is formed in the single crystal semiconductor substrate 100.

In ion introduction to the single crystal semiconductor layer 102, for example, the single crystal semiconductor layer 102 is irradiated with a planar ion beam, whereby ions can be efficiently introduced. In order to irradiate the single crystal semiconductor layer 102 with the planar ion beam, a so-called ion doping device may be used. Since in the ion doping device, mass separation is not performed generally, ions generated from an ion source can be used directly (in a plane) for irradiation.

As the above ions, ions whose source material is hydrogen such as $H^+$, $H_2^+$, $H_3^+$, and the like can be used. In particular, in irradiation with $H_3^+$, efficient ion introduction can be achieved as compared with the case of irradiation with the same amount of $H^+$ or $H_2^+$. $H_3^+$ is separated into $H^+$ in the single crystal semiconductor layer 102. In the case where mass separation is not performed, it is preferable that the ratio of $H_3^+$ be increased to shorten irradiation time or the like. Note that in the case of using ions whose source material is hydrogen as described above, it is preferable to use a hydrogen gas as a source gas. There is no need to interrupt the present invention as being limited to the use of the above ions, of course. For example, ions whose source material is a rare gas element may be used.

In the case of performing ion irradiation without mass separation as described above, it is likely to supply ions (impurity ions) other than desired ions. As such impurity ions, for example, a metal ion derived from an electrode in an ion source or a chamber and the like can be given. The metal ion has larger mass and lower speed at the time when the metal ion reaches an irradiated surface than ions whose source is hydrogen; therefore, the metal ion is introduced in the vicinity of a surface of an object. In this embodiment, since the oxide film 104 is formed on the surface of the single crystal semiconductor layer 102, intrusion of the metal ion into the single crystal semiconductor layer 102 can be suppressed. In order to obtain this effect, the oxide film 104 may be formed to have a larger thickness than the average depth where the metal ion is introduced. In the case of containing halogen in the oxide film 104, contamination of the single crystal semiconductor layer 102 can be prevented by fixing the introduced metal ion.

Next, a base substrate 110 which is bonded to the single crystal semiconductor substrate 100 is prepared. Although there is no particular limitation on the base substrate 110, a substrate formed using a semiconductor material which is similar to the single crystal semiconductor substrate 100 is used in this embodiment. For example, a substrate similar to that of the single crystal semiconductor substrate 100 may be used, or a single crystal semiconductor substrate with lower grade than the single crystal semiconductor substrate 100 may be used. As an example of the single crystal semiconductor substrate with lower grade, there is a substrate called SOG-Si (solar grade silicon) with Si purity of 99.9999%. Naturally, a polycrystalline semiconductor substrate, a compound semiconductor, or the like other than the above substrate can be used. Another substrate (e.g., a quartz substrate or the like) can be used as long as it can withstand thermal treatment.

In order to perform bonding between the base substrate 110 and the oxide film 104 favorably, a bonding surface may be activated. For example, either one or both of the surfaces which form the bond are irradiated with an atomic beam or an ion beam. In the case of using an atomic beam or an ion beam, a neutral atomic beam of an inert gas such as argon or an ion beam thereof can be used. Alternatively, the bonding surface can also be activated by plasma irradiation or radical treatment. With such activation treatment, it becomes possible to perform bonding between the single crystal semiconductor substrate and the base substrate even at relatively low temperature (for example, about 400° C. or lower).

Figure 1D:
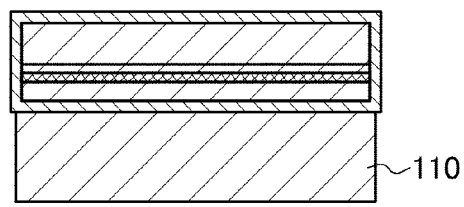

Next, the base substrate 110 and the oxide film 104 formed on the surface of the single crystal semiconductor layer 102 are bonded (see FIG. 1D). The oxide film 104 and the base substrate 110 are placed close to each other, whereby the substrates are attracted to each other by Van der Waals forces. Then, Si—OH generated on the surfaces of the substrate is bonded by hydrogen bond. By performing thermal treatment at low temperature (for example, from about 150 to 250° C.), dehydrogenation reaction is caused and water molecules are removed, so that a bond sandwiching an oxygen atom between silicon atoms can be formed. After that, by performing thermal oxidation at high temperature (for example, from about 400 to 700° C.), oxygen atoms are diffused and Si atoms are bonded, so that the oxide film 104 and the base substrate 110 are bonded more strongly.

Note that before the oxide film 104 and the base substrate 110 are bonded, it is preferable that the oxide film 104 and the base substrate 110 be subjected to surface treatment. As the surface treatment, ozone treatment (e.g., cleaning with ozone water) or ultrasonic cleaning (including so-called megasonic cleaning) and cleaning with ozone water can be performed. Cleaning with ozone water and cleaning with hydrofluoric acid may be repeated plural times. With such surface treatment, dust such as an organic substance and the like on the surfaces of the oxide film 104 and the base substrate 110 can be removed, and the surface of the oxide film 104 can be made hydrophilic.

After the single crystal semiconductor substrate 100 and the base substrate 110 are bonded in such a manner, one of or both heat treatment and the pressure treatment are preferably performed. Heat treatment or pressure treatment makes it possible to increase the bonding strength between the base substrate 110 and the oxide film 104. The heat treatment is performed at such temperature that an element or a molecule added to the embrittlement region 106 does not separate out, and the heating temperature is preferably 350° C. or lower. The pressure treatment is performed so that pressure can be applied in a direction perpendicular to the bonding surface, which is performed in consideration of resistance to pressure of the single crystal semiconductor substrate 100 and the base substrate 110.

Figure 1E:
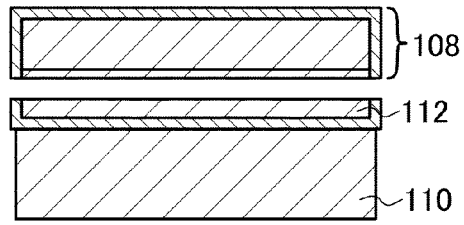

Next, thermal treatment is subjected to the single crystal semiconductor substrate 100, whereby the single crystal semiconductor layer 102 is divided along the embrittlement region 106 to separate the base substrate 110 to which a single crystal semiconductor layer 112 is attached and a single crystal semiconductor substrate 108 (see FIG. 1E). The thermal treatment here can be performed using an RTA (rapid thermal anneal) apparatus including an RTA apparatus using a halogen lamp or an infrared lamp for heating (LRTA: lamp rapid thermal anneal), a vertical furnace or the like. It is preferable that temperature of the base substrate 110 to which the single crystal semiconductor layer 112 is attached be increased to a temperature at about 550 to 650° C.

In this embodiment, thermal treatment is performed with use of a vertical furnace having resistance heating. Hereinafter, a procedure of the thermal treatment is described.

First, the base substrate 110 to which the single crystal semiconductor substrate 100 is bonded is mounted on a boat of the vertical furnace. The boat is transferred into a chamber of the vertical furnace. Then, it is preferable that the chamber be evacuated to have a vacuum state (or a reduced pressure state). A vacuum is approximately $5 \times 10^{-3}$ Pa, for example. After setting the chamber to a vacuum state, nitrogen is supplied to the chamber, so that the chamber is made to have a nitrogen atmosphere under an atmospheric pressure. In this period, the temperature is increased to 200° C.

After the chamber is set in a nitrogen atmosphere under atmospheric pressure, heating is performed at 200° C. for two hours. Then, the temperature is increased to 400° C. in one hour. After a state at a heating temperature of 400° C. becomes stable, the temperature is further increased to 600° C. in one hour. After the state at a heating temperature of 600° C. becomes stable, heating treatment is performed at 600° C. for two hours.

Then, the temperature is decreased to 400° C. in one hour, and after 10 to 30 minutes, the boat is transferred from the inside of the chamber. The single crystal semiconductor substrate 100 and the base substrate 110 over the boat are cooled down under the atmospheric pressure.

In the above-described thermal treatment with use of the resistance heating furnace, thermal treatment for increasing the bonding strength between the single crystal semiconductor layer 102 and the base substrate 110 and thermal treatment for causing separation along the embrittlement region 106 are carried out successively. In the case where different apparatuses are used for the two thermal treatment, for example, the thermal treatment is performed as follows. Thermal treatment is performed in the resistance heating furnace at a process temperature of 200° C. for a process time of about two hours, and the base substrate to which the single crystal semiconductor substrate 100 is bonded is transferred from the furnace. Then, thermal treatment is performed using an RTA apparatus at a process temperature of from 600 to 700° C. for a process time of about 1 to 30 minutes, so that the single crystal semiconductor layer 102 is divided (separated) along the embrittlement region 106.

Division (separation) is performed along the embrittlement region 106 by thermal treatment in such a manner, whereby the single crystal semiconductor layer 112 can be provided over the base substrate 110 with the oxide film 104 interposed therebetween (FIG. 1E). Further, reuse of the single crystal semiconductor substrate 108 obtained by dividing the single crystal semiconductor layer 112 makes it possible to reduce the cost of manufacture. Since the thermal treatment step illustrated in FIG. 1E is performed at a heat temperature of 700° C. or lower, which is a relatively low temperature, damage of the single crystal semiconductor substrate 100 due to heat can be suppressed, which is effective for reusing of the single crystal semiconductor substrate 100.

The single crystal semiconductor layer 112 illustrated in FIG. 1E has crystal defects caused by the ion introduction step, the separation step, and the like, and planarity of a surface thereof is degraded. When the single crystal semiconductor layer 112 has crystal defects, performance and reliability of transistors may be adversely affected, for example, increasing local level density in an interface between a gate insulating layer and the single crystal semiconductor layer 112 or the like. Further, it is difficult to form the gate insulating layer which is thin and has high withstand voltage on such a surface of the single crystal semiconductor layer 112 whose planarity is degraded.

Figure 1F:
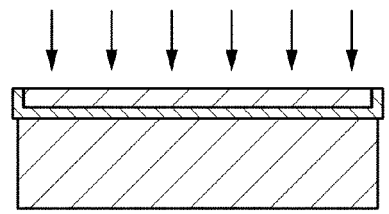

In order to remove defects in the single crystal semiconductor layer 112, the surface of the single crystal semiconductor layer 112 is irradiated with laser light (see FIG. 1F). By irradiation of the single crystal semiconductor layer 112 with laser light, the single crystal semiconductor layer 112 can be melted. The melted portion in the single crystal semiconductor layer 112 by laser light is cooled and solidified, and planarity of the surface is improved. The crystal defects in the single crystal semiconductor layer 112 are reduced by the laser light irradiation, and crystallinity of the single crystal semiconductor layer 112 can be improved.

Note that it is preferable that the single crystal semiconductor layer 112 be partially melted by the laser light irradiation. This is because, if the single crystal semiconductor layer is completely melted, it is microcrystallized due to disordered nucleation after being in a liquid phase, so that crystallinity of the single crystal semiconductor layer is highly likely to decrease. On the contrary, by partial melting, crystal growth proceeds from a solid phase part, which is not melted. Accordingly, crystal defects in the semiconductor film can be reduced. Note that the term "complete melting" here refers to that melting the single crystal semiconductor layer 112 is extended to the lower interface of the single crystal semiconductor layer to be made in a liquid state. On the other hand, in this case, the term "partial melting" refers to that the upper part of the single crystal semiconductor layer 112 is melted and is in a liquid phase while the lower part thereof is not melted and is still in a solid phase.

As laser light, any of a continuous wave laser, a pseudo continuous wave laser, or a pulsed laser may be used. In particular, a pulsed laser is preferably used. The pulsed laser can realize a high energy state instantaneously and form a melted state easily. The oscillating frequency is preferably from about 1 Hz to 10 MHz.

As a laser, for example, an excimer laser such as a KrF laser, or a gas laser such as an Ar laser or a Kr laser can be used. Alternatively, as a solid-state laser, a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like may be used.

A wavelength of the laser light is a wavelength that is absorbed in the single crystal semiconductor layer 112, which can be determined by considering the skin depth of the laser light in the single crystal semiconductor layer 112 and the like. For example, the wavelength can be in the range of from 250 to 700 nm. In addition, the energy of the laser light can be determined in considering the wavelength of laser light, the skin depth of the laser light, the thickness of the single crystal semiconductor layer 112, and the like. The energy of laser light can be, for example, in the range of from 300 to 800 $mJ/cm^2$. Irradiation with laser light can be performed in an atmosphere containing oxygen such as the atmospheric air or an inert atmosphere such as a nitrogen atmosphere. An inert atmosphere such as a nitrogen atmosphere can improve planarity of the single crystal semiconductor layer 112 with higher effect than the atmospheric air, and can suppress generation of a crack with higher effect than the atmospheric air.

Here, repairing surface unevenness and nanoscale crystal defects of a semiconductor layer by laser light irradiation is reproduced by classical molecular dynamics simulation. Specifically, a process is described, in which an upper part of a single crystal silicon layer having surface unevenness and nanoscale crystal defects is heated to melt the single crystal silicon layer partially, and silicon atoms are rearranged by using solid phases left on a lower part as seed crystal.

In the classical molecular dynamics method, a function (interatomic potential) which corresponds to movement of real atoms is made and force acting on each atom is evaluated with use of the function, and Newton's equation of motion is solved, whereby motion (time-dependent change) of each atom can be tracked. In the actual simulation procedure, the following cycle is repeated.

(1) initial conditions such as initial coordinates and initial speed (temperature) are given to atoms in simulation.
(2) atomic force is calculated by using interatomic potential.
(3) positions and speed of atoms after time step Δt are calculated.
(4) operation returns to (2).

In accordance with the above procedure, temporal trajectories of each atom can be evaluated. Note that as software of the classical molecular dynamics simulation for performing the above simulation, Materials Explorer 5.0 manufactured by Fujitsu Limited was used.

A variety of models are proposed for interatomic potential of silicon. Here, Tersoff potential is used, which can reproduce physical property values which are obtained by experiments most favorably at this time. Note that there is a certain difference between temperature of the Tersoff model and real temperature. However, the difference is just a problem in simulation, and the temperature of the Tersoff model can be converted into the real temperature based on a melting point. The experimental value of melting point of silicon is about 1414° C., which corresponds to a temperature at about 2327° C. in the Tersoff model. Hereinafter, the temperature which is converted based on the real melting point of silicon is referred to as the converted temperature for convenience.

Next, a simulation model for planarization and re-single-crystallization of a single crystal silicon layer (a (100) plane) and a simulation condition thereof are described. The size of a unit cell (a simulation unit cell) used in simulation is set to be 3.26 nm in the x-axis direction, 3.26 nm in the y-axis direction, and 6.52 nm in the z-axis direction. Here, the x-axis and the y-axis are in the direction parallel to the single crystal silicon layer, and the z-axis is in the thickness direction of the single crystal silicon layer. Note that in the simulation, the periodic boundary condition is applied in the x-axis direction and the y-axis direction so that a film which is sufficiently large in the x-axis direction and the y-axis direction can be assumed.

As a simulation model, a single crystal silicon layer having surface unevenness and nanoscale crystal defects inside was employed under the following conditions.

A projected portion in a pyramidal shape exists on a surface of the single crystal silicon layer.

The height of the projected portion (a difference in height on the surface of the single crystal silicon layer) is 1.36 nm.

Silicon atoms in a region within 1 nm in radius with a coordinate (1.63, 1.63, 2.17) as a center are removed (in total, 191 atoms), so that a spherical crystal defect of about 2 nm in diameter is formed, where each parameter of the above coordinate corresponds to a distance (nm) from the origin position.

The number of silicon atoms in the simulation unit cell is 1706.

Seven atomic layers (in total, 504 atoms) in the lower portion of the single crystal silicon layer are seed crystal; thus, positions of atoms are fixed (assumed as a solid-phase state).

Figure 2A:
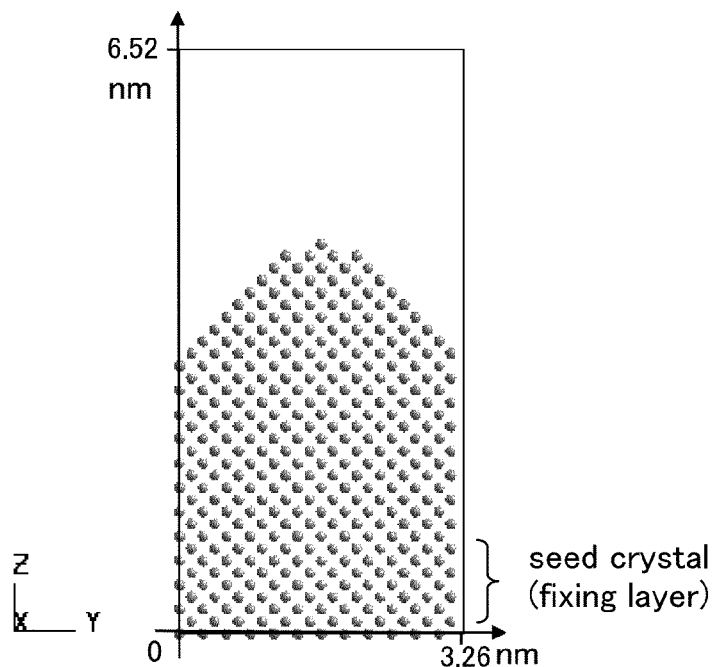
FIGS. 2A and 2B are cross-sectional views of y-z plans of the calculation models.
Figure 2B:
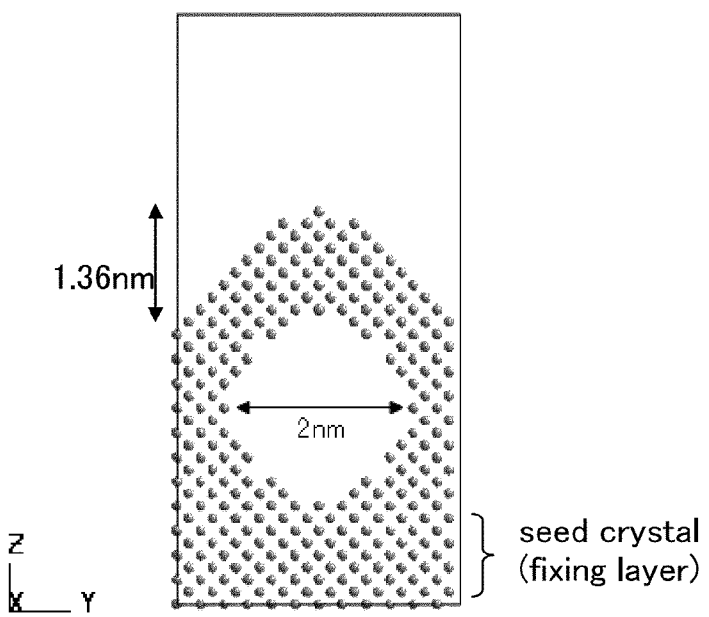
Figure 3A:
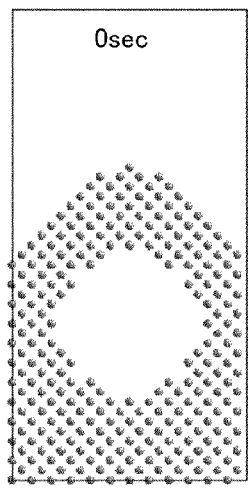
FIGS. 3A to 3F illustrate change in a structure by calculation.
Figure 3B:
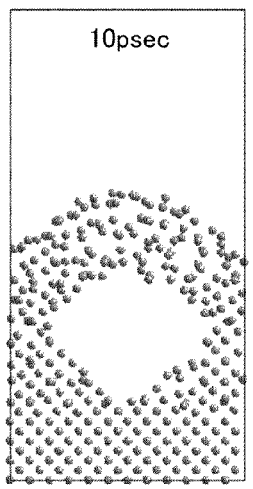
Figure 3C:
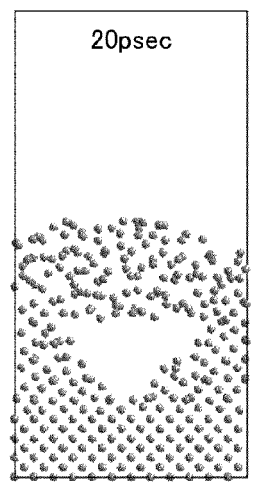
Figure 3D:
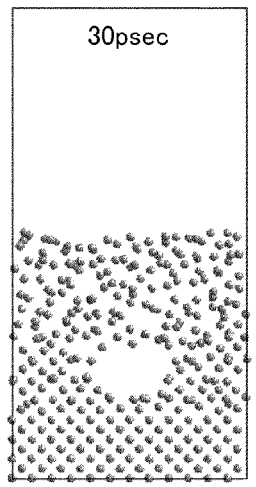
Figure 3E:
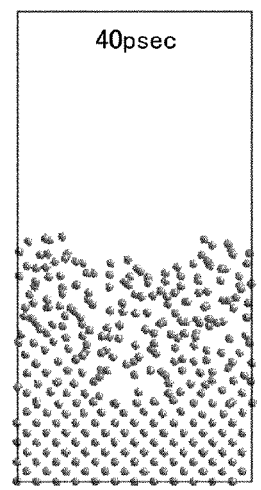
Figure 3F:
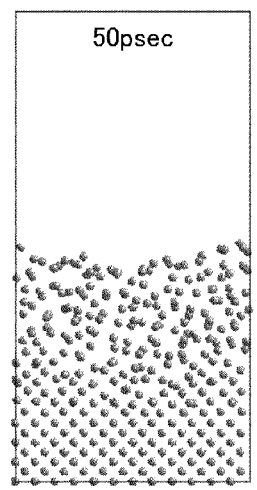

FIG. 2A illustrates the above simulation model viewed in the direction perpendicular to the y-z plan. FIG. 2B illustrates a cross-sectional view of a plane which passes through the center of the spherical crystal defect and be in parallel to the y-z plan in the above simulation model. Note that FIG. 2B illustrates the above simulation model with a thickness of 0.65 nm in the x-axis direction, which does not strictly mean that only a cross section passing through the center of the spherical crystal defect is illustrated.

With use of the above simulation model, the classical molecular dynamics simulation was performed on such initial condition of temperature that the converted temperature is at 1458° C. (the melting point or higher). In this embodiment, the simulation was performed on the constant temperature condition (at a converted temperature of 1458° C.) from the initial state (0 sec) to 700 psec.

FIGS. 3A to 3F illustrate change in a structure of the single crystal silicon layer over time. In FIGS. 3A to 3F, change in a structure of the single crystal silicon layer from the initial state (0 sec) to 50 psec is shown at 10 psec intervals. In accordance with FIGS. 3A to 3C, it is found that the projected portion of the surface is melted and the crystal defect disappears at about 50 psec, so that the single crystal silicon layer is planarized.

Figure 4C:
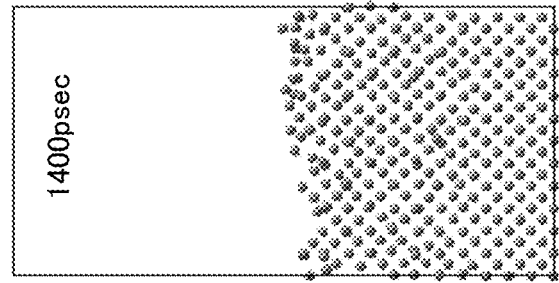
FIGS. 4A to 4C illustrate change in the structure by calculation.
Figure 4B:
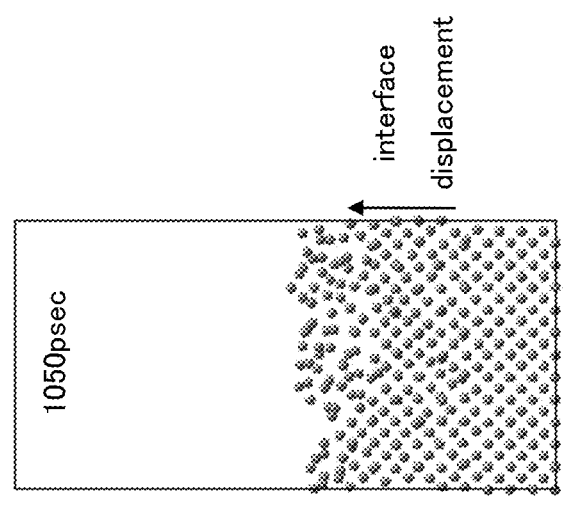
Figure 4A:
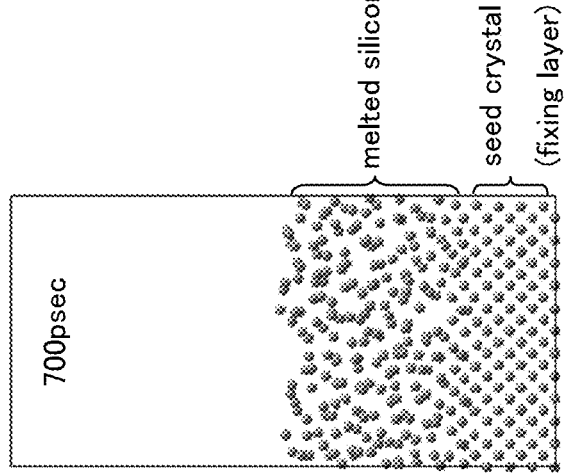

After 700 psec, the classical molecular dynamics simulation was performed on such a condition that the converted temperature is lowered to 1276° C. which is lower than the melting point. Here, the temperature condition was constant (1276° C.) from 700 psec to 1400 psec. FIGS. 4A to 4C illustrate change in the structure of the single crystal silicon layer over time after 700 psec. In FIGS. 4A to 4C, change in the structure of the single crystal silicon layer from 700 psec to 1400 psec is shown at 350 psec intervals.

In accordance with FIGS. 4A to 4C, the solid-liquid interface is raised toward the surface of the single crystal silicon layer over time, and it is found that melted silicon turns into crystal silicon using the solid-phase portion as seed crystal. After 1400 psec, re-single-crystallization was conducted up to the vicinity of the surface.

As described above, the upper part of the single crystal silicon layer having surface unevenness and nanoscale crystal defects was heated and melted, whereby reduction of the surface unevenness and disappearance of the crystal defect can be verified. In addition, the silicon atoms are rearranged using the solid phases left in the lower part as seed crystal, and crystal growth proceeds.

In accordance with results of the classical molecular dynamics simulation described above, in the case where the crystal defect is about 2 nm in diameter and the surface unevenness has a difference in height of about 1.5 nm, defects can be sufficiently repaired even for a melting time of about 50 psec. Further, with a melting time of at least about 700 psec, the silicon atoms can be rearranged (re-single-crystallized) using solid phases left in the lower part as seed crystal. The melting time of a semiconductor film in the case of using pulsed laser is generally the same or substantially the same as the pulse width of laser light. Thus, when the pulse width is 50 psec or more, crystal defects of about 2 nm in diameter and the surface unevenness with a difference in height of about 1.5 nm can be repaired. In a manner similar to the above, when the pulse width is 700 psec or more, rearrangement (re-single-crystallization) of the silicon atoms is possible. That is, in order to realize reduction of the crystal defect and the surface unevenness and rearrangement (re-single-crystallization) of the silicon atoms, a pulsed laser with a pulse width of 700 psec or more may be used. In this embodiment, a pulsed laser with a pulse width of 25 nsec, for example, is used.

When laser irradiation is performed, the single crystal semiconductor layer 112 may be heated. The heating temperature is preferably from 400 to 670° C., more preferably from 450 to 650° C.; however, it is not necessary that the heating temperature be limited to the above range.

Before the single crystal semiconductor layer 112 is irradiated with laser light, it is preferable that an oxide film such as a native oxide film formed on the surface of the single crystal semiconductor layer 112 be removed. This is because when laser light irradiation is performed in such a state that the oxide film is left on the surface of the single crystal semiconductor layer 112, the effect of planarization is hardly obtained. The treatment for removing the oxide film can be performed by, for example, processing the single crystal semiconductor layer 112 with a hydrofluoric acid solution. It is desirable that removal of the oxide film with the hydrofluoric acid be performed until the surface of the single crystal semiconductor layer 112 has repellency. Removal of the oxide film can be confirmed by the repellency on the surface.

Further, before the single crystal semiconductor layer 112 is irradiated with laser light, it is preferable that the single crystal semiconductor layer 112 be etched to remove the embrittlement region 106 left on the separation plan of the single crystal semiconductor layer 112. By removal of the embrittlement region 106, a surface planarization effect and a crystallinity recovery effect which are produced by laser light irradiation can be enhanced.

This etching can be performed by a dry etching process or a wet etching process. Examples of etching gases that can be used in dry the etching process include: chloride gases such as boron chloride, silicon chloride, and carbon tetrachloride; a chlorine gas; fluoride gases such as sulfur fluoride and nitrogen fluoride; an oxygen gas; and the like. In the case of the wet etching process, as etchant, a tetramethylammonium hydroxide (abbreviation: TMAH) solution can be, for example, used.

After the laser light irradiation, the single crystal semiconductor layer 112 may be further subjected to planarization treatment. As for planarization treatment, for example, one of a CMP process, a dry etching process, and a wet etching process or a combination thereof may be used. Before this planarization treatment is performed, the single crystal semiconductor layer 112 has been irradiated with laser light to planarize the surface thereof, thus, the grinding level of this planarization treatment can be reduced as compared with the case where CMP or etching is employed without laser light irradiation. Accordingly, since there is no need to consider reduction of the thickness by grinding in formation of the single crystal semiconductor layer 102, time needed for epitaxial growth can be reduced, and productivity of an SOI substrate can be improved.

Further, with this planarization treatment, the single crystal semiconductor layer 112 may be thinned to have a desired thickness. The thickness of the single crystal semiconductor layer 112 can be determined in accordance with characteristics of an element to be formed with the single crystal semiconductor layer 112. In order to form a thin gate insulating layer with excellent step coverage to cover an edge of the single crystal semiconductor layer 112, the unevenness due to the single crystal semiconductor layer 112 is preferably 50 nm or less and, for example, the thickness of the single crystal semiconductor layer 112 may be from 5 to 50 nm.

Figure 1G:
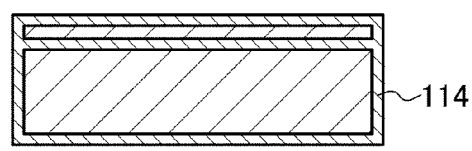

By the step illustrated in FIG. 1F, crystal defects in the single crystal semiconductor layer 112 can be repaired, and planarity can be improved. However, in the laser light irradiation, impurities in the air may enter into the single crystal semiconductor layer 112. Further, by performing planarization treatment of CMP or etching, an abrasive of CMP, an etchant, or the like may be left on the surface of the single crystal semiconductor layer 112. In order to remove these impurities, the single crystal semiconductor layer 112 is subjected to thermal oxidation treatment to form an oxide film 114 (see FIG. 1G). In this embodiment, since the base substrate 110 is formed using a material similar to that of the single crystal semiconductor substrate 100, the oxide film 114 is formed also on the surface of the base substrate 110. Note that the thermal oxidation treatment performed on the base substrate 110 can be performed in a manner similar to the thermal oxidation treatment performed on the single crystal semiconductor substrate 100 illustrated in FIG. 1B. Here, it is also preferable that halogen be added to the atmosphere.

The thermal oxidation treatment is performed at 900 to 1150° C. By performing thermal treatment within such a temperature range, similar to the case of FIG. 1B, impurities in the single crystal semiconductor layer 112 are removed, and the impurities can be fixed in the oxide film 114. Accordingly, deterioration in characteristics of the single crystal semiconductor layer 112 due to the impurities can be prevented. By the above thermal oxidation treatment, impurities derived from ion introduction in FIG. 1C can also be removed and fixed.

Figure 1H:
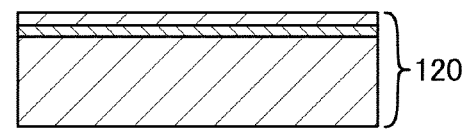

Next, the oxide film 114 is removed (see FIG. 1H). There is no particular limitation on a removal method of the oxide film 114. For example, the removal can be performed using buffered hydrofluoric acid or an etchant containing another fluorinated acid.

Through the above-described steps, an SOI substrate 120 in which the single crystal semiconductor layer 112 is provided over the base substrate 110 with the oxide film 104 interposed therebetween can be formed. By the manufacturing method described in this embodiment, the SOI substrate 120 provided with the single crystal semiconductor layer 112 with favorable planarity, in which crystal defects and concentration of impurities are reduced, can be obtained. With use of the SOI substrate, a semiconductor element with excellent characteristics can be formed.

Figure 5:
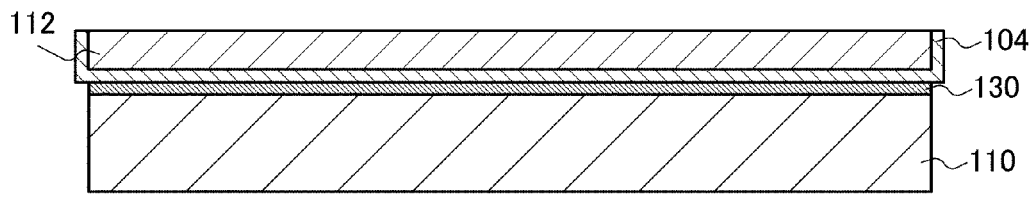
FIG. 5 illustrates an example of a structure of an SOI substrate according to an embodiment of the present invention.
Figure 6:
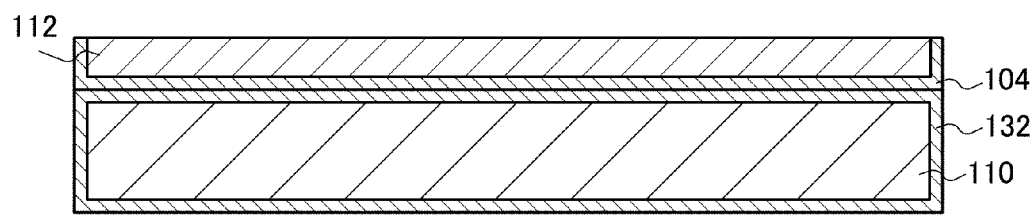
FIG. 6 illustrates an example of a structure of an SOI substrate according to an embodiment of the present invention.
Figure 7:
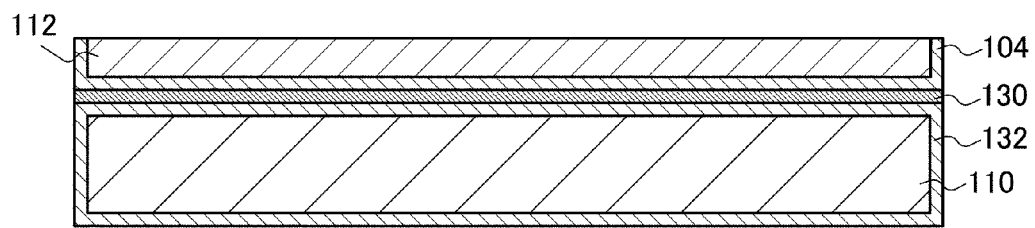
FIG. 7 illustrates an example of a structure of an SOI substrate according to an embodiment of the present invention.

Note that the embodiment of the present invention is not limited to the structure illustrated in FIGS. 1A to 1H, and any structure illustrated in FIG. 5, FIG. 6, and FIG. 7 may be employed. FIG. 5 illustrates a structure in which the single crystal semiconductor layer 112 is provided over the base substrate 110 with an insulating film 130 and the oxide film 104 interposed therebetween. The insulating film 130 can be formed using a material such as silicon oxide, silicon oxynitride, silicon nitride, or silicon nitride oxide over the base substrate 110. The insulating film 130 may be formed with a single layer or a layered structure.

For example, in the case of using silicon oxide for the insulating film 130, the insulating film 130 can be formed with use of a mixed gas of silane and oxygen, a mixed gas of TEOS (tetraethoxysilane) and oxygen, or the like by a vapor deposition method such as a thermal CVD (chemical vapor deposition) method, a plasma CVD method, an atmospheric pressure CVD method, or an ECRCVD (electron cycrotron resonance chemical vapor deposition) method. The thickness of the insulating film 130 can be from 10 to 1000 nm (preferably, from 50 to 300 nm). Note that, a surface of the insulating film 130 may be densified with oxygen plasma treatment. Meanwhile, in the case of using silicon nitride for the insulating film 130, the insulating film 130 can be formed with use of a mixed gas of silane and ammonia by a vapor deposition method such as a plasma CVD method. In addition, in the case of using silicon nitride oxide for the insulating film 130, the insulating film 130 may be formed with use of a mixed gas of silane and ammonium or a mixed gas of silane and nitrogen oxide by a vapor deposition method such as a plasma CVD method.

Alternatively, the insulating film 130 may be formed using silicon oxide which is formed with use of an organosilane gas by a chemical vapor deposition method. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Note that in this specification, an oxynitride is a substance that contains more oxygen than nitrogen, and a nitride oxide is a substance that contains more nitrogen than oxygen. For example, silicon oxynitride is a substance including oxygen, nitrogen, silicon, and hydrogen in ranges of from 50 to 70 at. %, from 0.5 to 15 at. %, from 25 to 35 at. %, and from 0.1 to 10 at. %, respectively. Further, silicon nitride oxide is a substance including oxygen, nitrogen, silicon, and hydrogen in ranges of from 5 to 30 at. %, from 20 to 55 at. %, from 25 to 35 at. %, and from 10 to 30 at. %, respectively. Note that the above-described composition ranges are obtained by using Rutherford backscattering spectrometry (RBS) or hydrogen forward scattering (HFS). Moreover, the total of the percentage of the constituent elements does not exceed 100 at. % except impurities.

After the insulating film 130 is formed over the base substrate 110, the single crystal semiconductor substrate 100 in which the oxide film 104 is formed on the surface thereof and the embrittlement region 106 is formed in a region at a predetermined depth from the surface thereof (see FIGS. 1A and 1B) and the base substrate 110 are bonded with the oxide film 104 and the insulating film 130 interposed therebetween. Next, thermal treatment is performed to divide the single crystal semiconductor substrate along the embrittlement region 106, so that the single crystal semiconductor layer 112 can be formed over the base substrate 110. Note that the subsequent steps are similar to the steps illustrated in FIGS. 1F, 1G, and 1H; thus description thereof is omitted here.

By the above steps, the SOI substrate illustrated in FIG. 5 can be formed. Although an example in which the insulating film 130 is provided on the base substrate 110 side is shown here, the present invention is not limited thereto, and a structure in which the insulating film 130 is provided on the single crystal semiconductor substrate 100 side may be used. In that case, after the oxide film 104 is formed on the surface of the single crystal semiconductor substrate 100, the insulating film 130 is formed.

Since the oxide film 104 obtained by thermal oxidation treatment has planarity, in the case of forming the insulating film 130 over the oxide film, the insulating film 130 can have improved planarity. Thus, the single crystal semiconductor substrate 100 and the base substrate 110 can be favorably bonded. Alternatively, in the case of forming the insulating film 130 on the base substrate 110 side, the single crystal semiconductor substrate 100 and the base substrate 110 can be bonded by the effect of improved planarity of the insulating film 130 even when the base substrate 110 has some surface unevenness.

FIG. 6 illustrates a structure in which the single crystal semiconductor layer 112 is provided over the base substrate 110 with an oxide film 132 and the oxide film 104 interposed therebetween. In this embodiment, since the base substrate 110 is a semiconductor substrate, the oxide film 132 can be formed by performing thermal oxidation treatment on the base substrate 110. Here, the formation step of the oxide film 132 is similar to that of the oxide film 104.

The oxide film 132 formed on the surface of the base substrate 110 in such a manner has an effect of removal and fixing of impurities by an effect of halogen contained in the oxidation atmosphere.

The manufacturing steps other than the formation step of the oxide film 132 are similar to those illustrated in FIGS. 1A to 1H; thus detail description is omitted here.

The oxide films are formed on the surface of the single crystal semiconductor substrate 100 and the surface of the base substrate 110 by thermal oxidation, whereby impurities can be prevented from diffusing from the base substrate 110 to the single crystal semiconductor layer 112. Further, the oxide film obtained by thermal oxidation treatment has high planarity; thus, the single crystal semiconductor substrate 100 and the base substrate 110 can be favorably bonded.

FIG. 7 illustrates a structure in which the single crystal semiconductor layer 112 is provided over the base substrate 110 with the oxide film 132, the insulating film 130, and the oxide film 104 interposed therebetween. The oxide film 132 and the insulating film 130 can be formed by the aforementioned method. Note that the insulating film 130 can be provided for one of or both the single crystal semiconductor substrate 100 and the base substrate 110.

The manufacturing steps are similar to the above steps; thus detail description is omitted here.

The oxide films are formed on the surface of the single crystal semiconductor substrate 100 and the surface of the base substrate 110 by thermal oxidation treatment, whereby impurities can be prevented from diffusing from the base substrate 110 to the single crystal semiconductor layer 112. Since the oxide film obtained by performing thermal oxidation treatment has high planarity, the single crystal semiconductor substrate 100 and the base substrate 110 can be favorably bonded. Further, formation of the insulating film 130 makes it possible to bond the single crystal semiconductor substrate 100 and the base substrate 110 by the effect of improved planarity of the insulating film 130 even when the base substrate 110 and the like have some surface unevenness.

In accordance with a series of steps described in this embodiment, a highly excellent SOI substrate can be manufactured. For example, the single crystal semiconductor layer is formed by an epitaxial growth method, whereby crystal defects due to the single crystal semiconductor substrate can be reduced. Accordingly, increase in defects generated in the later step (e.g., an ion introduction step, a heating separation step, or the like) can be suppressed. By thermal oxidation performed in an atmosphere containing halogen, impurities in the single crystal semiconductor layer can be removed, and the impurities can be fixed in the oxide film. Furthermore, by laser light irradiation, minute voids and defects in the single crystal semiconductor layer due to ion introduction can be reduced.

In the present invention, the single crystal semiconductor layer which is formed by an epitaxial growth method in advance is used for manufacturing the SOI substrate. Thus, the semiconductor layer can have a small thickness as compared with the case where after an SOI substrate is formed without using an epitaxial growth method, the thickness of a semiconductor layer of the SOI substrate is increased by an epitaxial growth method. Accordingly, more excellent semiconductor characteristics can be obtained.

An ion irradiation method used in the present invention is examined below.

In the present invention, a single crystal semiconductor substrate is irradiated with ions that are derived from hydrogen (H) (hereinafter, referred to as "hydrogen ion species") as an example. More specifically, a hydrogen gas or a gas which contains hydrogen in its composition is used as a source material; a hydrogen plasma is generated; and a single crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 8:
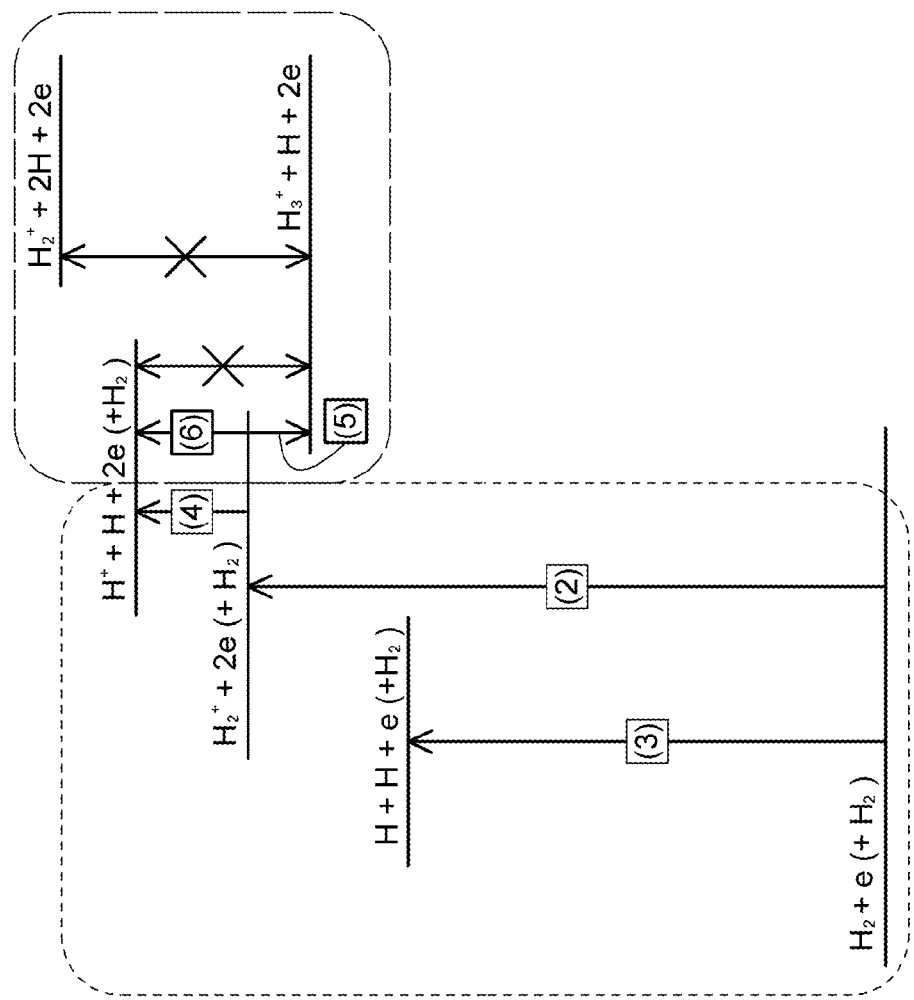
FIG. 8 illustrates an energy diagram of hydrogen ion species.

FIG. 8 is an energy diagram which schematically shows some of the above reactions. The energy diagram shown in FIG. 8 is merely a schematic diagram and does not depict the relationships of energies of the reactions exactly. Note that reaction of the following reaction equations are not experimentally observed, which are indicated by cross marks in FIG. 8.

$$H_2 + H^+ \rightarrow H_3^+ \quad (10)$$

$$H_2 + H \rightarrow H_3^+ \quad (11)$$

Note that reaction equations (5), (6), (10) and (11) represent reactions due to electron-electron collision, and the other reaction equations represent reactions due to molecular-ion collision.

($H_3^+$ Formation Process)

As described above, $H_3^+$ is mainly generated through the reaction process that is represented by the reaction equation (5). On the other hand, as a reaction that competes with the reaction equation (5), there is the reaction process represented by the reaction equation (6). For the amount of $H_3^+$ to increase, at least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy of a charged particle gained before colliding with another particle is equal to the difference between a potential energy at a potential before the charged particle moves and a potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 9:
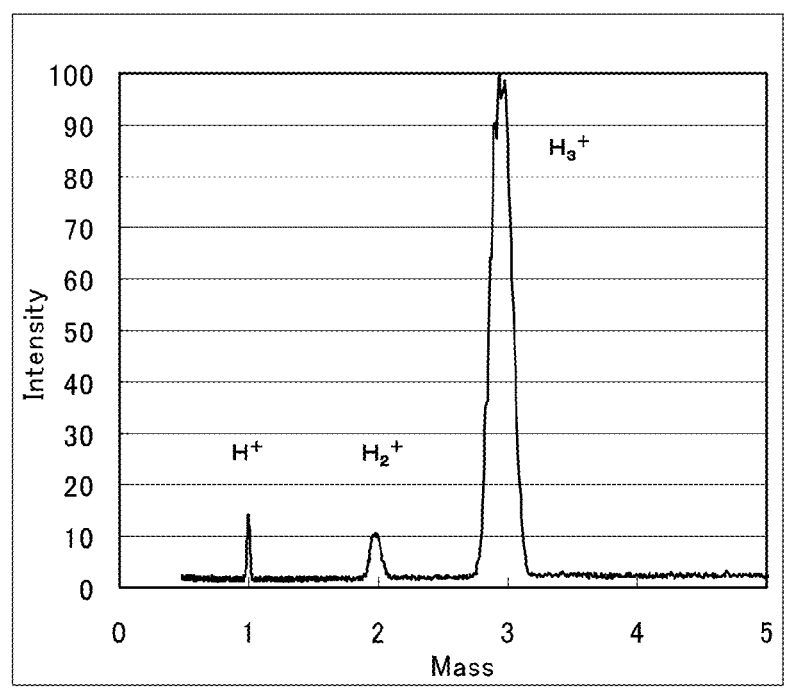
FIG. 9 is a graph showing the result of ion mass spectrometry.

Here, an example in which the proportions of ion species (particularly, the proportion of $H_3^+$) are different is described. FIG. 9 is a graph showing results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 9, the number of ions with different masses is expressed as a relative proportion where the number of ions with a mass of 3 is defined as 100. It can be seen from FIG. 9 that the ratio between ion species that are generated from the ion source, i.e., the ratio between $H^+$, $H_2^+$, and $H_3^+$, is approximately 1:1:8. Note that ions at such a ratio can also be generated by an ion doping apparatus which has a plasma source portion (ion source) that generates a plasma, an extraction electrode that extracts an ion beam from the plasma, and the like.

Figure 10:
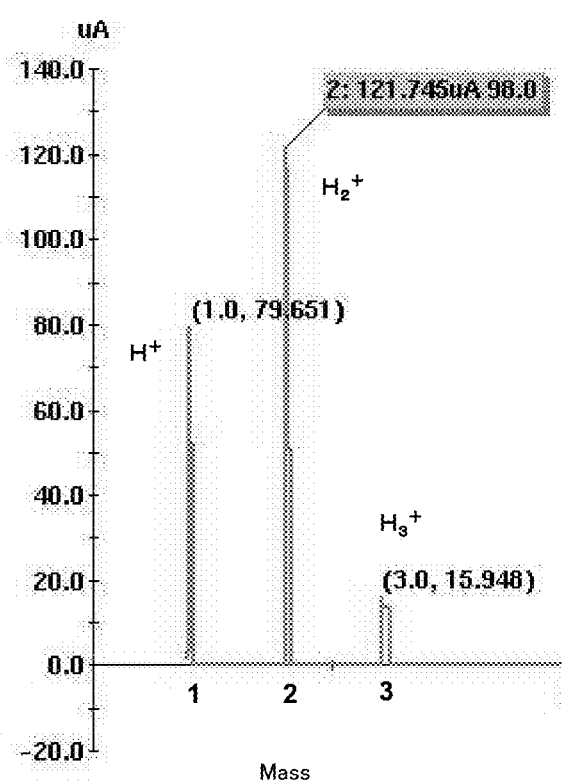
FIG. 10 is a graph showing the result of ion mass spectrometry.

FIG. 10 is a graph showing the results of mass spectrometry of ions that are generated from $PH_3$ when an ion source different from that for the case of FIG. 9 is used and the pressure of the ion source is about $3\times10^{-3}$ Pa. The results of this mass spectrometry focus on the hydrogen ion species. In addition, the mass spectrometry was performed by measurement of ions that were extracted from the ion source. As in FIG. 9, the horizontal axis of FIG. 10 represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 10 that the ratio between ion species in plasma, i.e., the ratio between $H^+$, $H_2^+$, and $H_3^+$, is about 37:56:7. Note that, although FIG. 10 shows the data obtained when the source gas is $PH_3$, the ratio between the hydrogen ion species is about the same when a 100% hydrogen gas is used as a source gas, as well.

In the case of the ion source from which the data shown in FIG. 10 is obtained, $H_3^+$, of $H^+$, $H_2^+$, and $H_3^+$, is generated at a proportion of only about 7%. On the other hand, in the case of the ion source from which the data shown in FIG. 9 is obtained, the proportion of $H_3^+$ ions can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 9 is generated and a single crystal semiconductor substrate is irradiated with the generated ion species without any mass separation being performed, the surface of the single crystal semiconductor substrate is irradiated with each of $H^+$, $H_2^+$, and $H_3^+$ ion species. In order to reproduce the mechanism, from the irradiation with ions to the formation of an ion introduction region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of a Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species with Si atoms.

Figure 11:
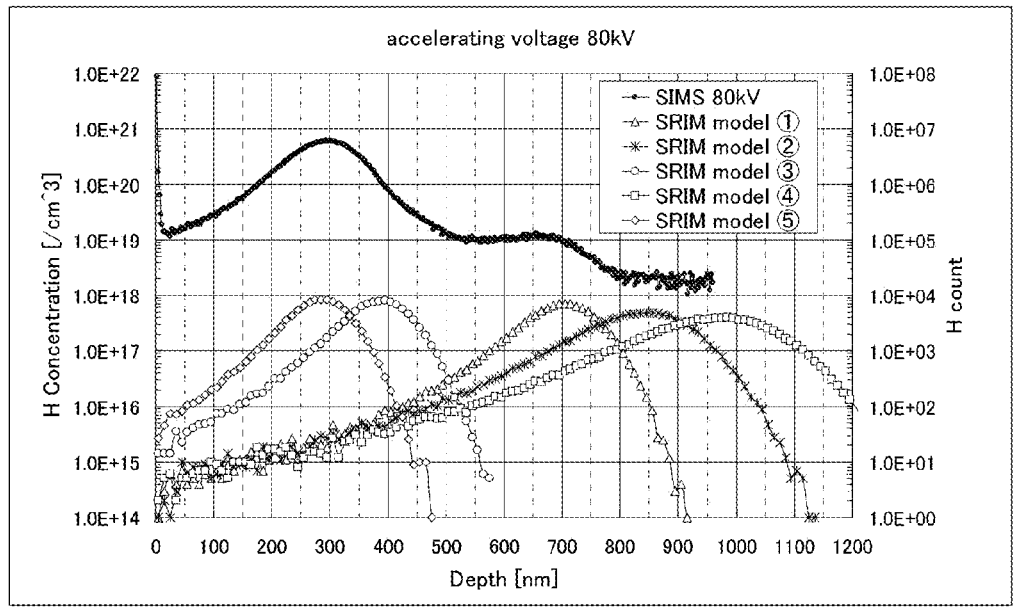
FIG. 11 is a graph showing the profile (measured values and calculated values) of hydrogen atoms in the depth direction when the accelerating voltage is 80 kV.

FIG. 11 shows the number of hydrogen atoms in a Si substrate (calculation results) obtained when the Si substrate is irradiated with the hydrogen ion species (irradiation with 100,000 atoms for H) using Models 1 to 5. FIG. 11 also shows the hydrogen concentration (secondary ion mass spectrometry (SIMS) data) in a Si substrate irradiated with the hydrogen ion species of FIG. 9. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of the Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is about several kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 12:
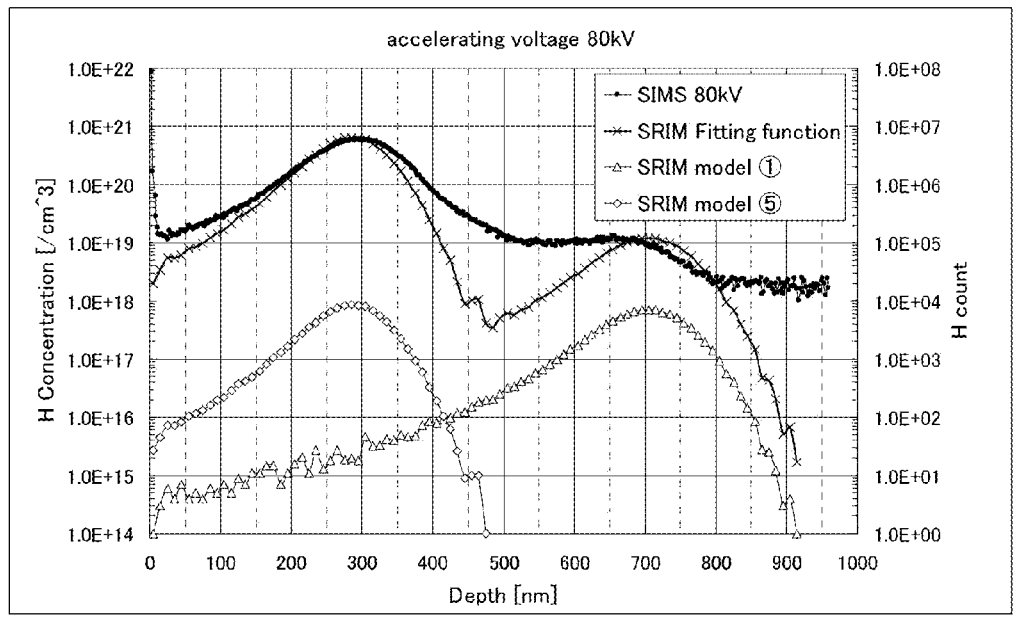
FIG. 12 is a graph showing the profile (measured values, calculated values, and fitting functions) of hydrogen atoms in the depth direction when the accelerating voltage is 80 kV.
Figure 13:
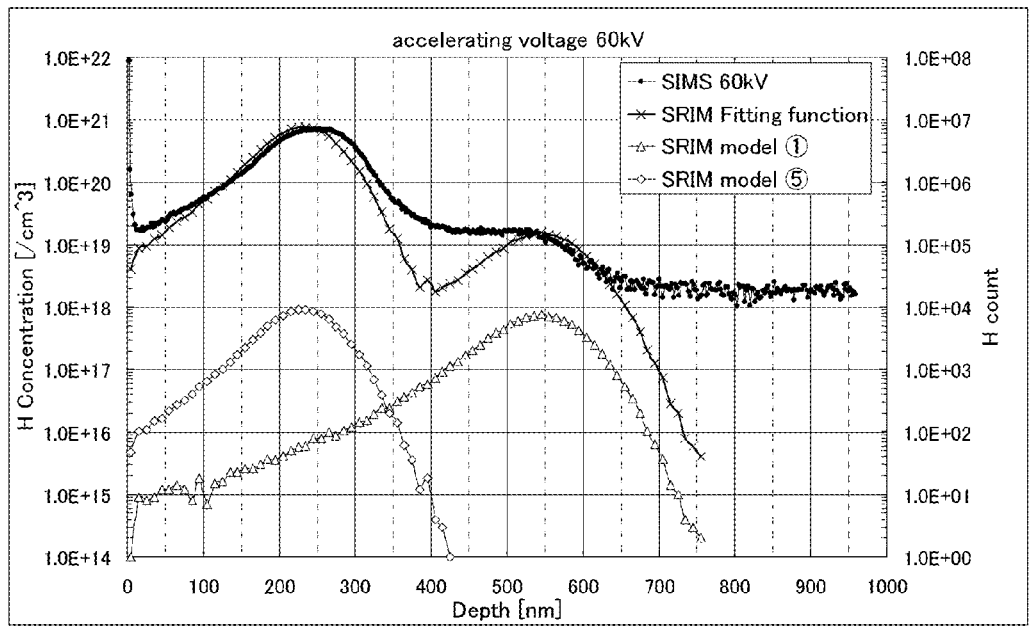
FIG. 13 is a graph showing the profile (measured values, calculated values, and fitting functions) of hydrogen atoms in the depth direction when the accelerating voltage is 60 kV.
Figure 14:
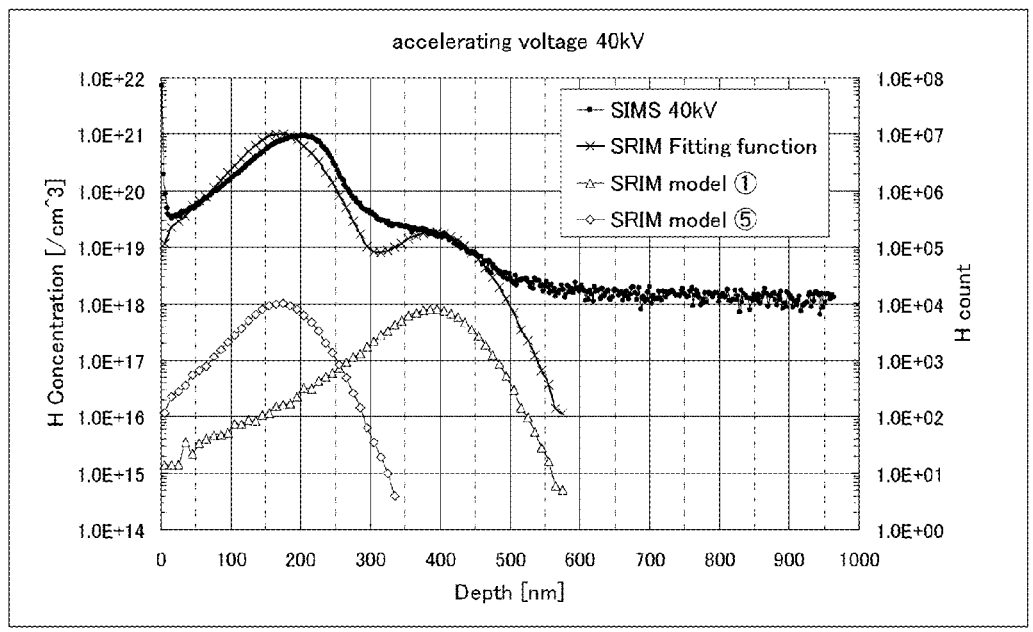
FIG. 14 is a graph showing the profile (measured values, calculated values, and fitting functions) of hydrogen atoms in the depth direction when the accelerating voltage is 40 kV.

Accordingly, Models 2 to 4 will not be considered hereinafter. FIGS. 12 to 14 each show the calculation results obtained when irradiation with the hydrogen ion species (irradiation with 100,000 atoms for H) is performed using Models 1 and 5. FIGS. 12 to 14 also each show the hydrogen concentration (SIMS data) in a Si substrate irradiated with the hydrogen ion species of FIG. 9, and the simulation results fitted to the SIMS data (hereinafter referred to as a fitting function). Here, FIG. 12 illustrates the case where the accelerating voltage is 80 kV; FIG. 13, the case where the accelerating voltage is 60 kV; and FIG. 14, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a Si substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons. Because the amount of hydrogen introduced through the irradiation process represented by Model 3 is lower than that introduced through the irradiation process of Model 5, there is no significant influence even if Model 3 is excluded from the consideration (no peak appears in the SIMS data either). Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 15 lists the aforementioned fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately 42 to 45), and the ratio of the number of ion species used for irradiation, $H_3^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 9. For example, because $H_3^+$ splits into $H^+$, H, or the like to be introduced into a substrate, ion introduction efficiency can be improved compared with the case of irradiation mainly with $H^+$ or $H_2^+$. This leads to an improvement in semiconductor substrate production efficiency. In addition, because the kinetic energy of $H^+$ or H after $H_3^+$ splits tends to be low, $H_3^+$ is suitable for manufacture of thin semiconductor layers.

Note that, in this specification, a method is described in which an ion doping apparatus that is capable of irradiation with the hydrogen ion species as shown in FIG. 9 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

Embodiment 2

In this embodiment, a method for manufacturing an SOI substrate which is different from that in the above-described embodiment will be described with reference to drawings. Specifically, a case where an SOI substrate is manufactured by using a single crystal semiconductor substrate with a rounded corner (edge portion) (with edge roll-off (ERO)) is described. Further, a case where the single crystal semiconductor substrate is repeatedly used (reused) will be described with reference to drawings.

First, the single crystal semiconductor substrate 100 (here, a single crystal silicon substrate) is prepared. The single crystal semiconductor layer 102 and the oxide film 104 are provided on a surface of the single crystal semiconductor substrate 100, and the embrittlement region 106 is formed in a region at a depth from a surface of the single crystal semiconductor layer 102 (see FIG. 16A). Note that the formation method of the single crystal semiconductor substrate 100 having the structure of FIG. 16A is similar to those illustrated in FIGS. 1A to 1C; thus description thereof is omitted here.

Figure 16A:
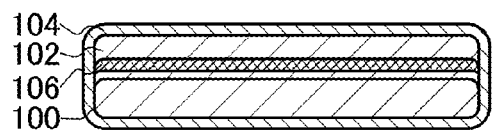
FIGS. 16A to 16I illustrate an example of a method for manufacturing an SOI substrate according to an embodiment of the present invention.

In this embodiment, since an edge portion of the single crystal semiconductor substrate 100 has a rounded shape as illustrated in FIG. 16A, the oxide film 104 is formed along the surface of the edge portion.

Figure 16B:
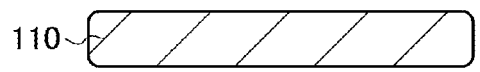
Figure 16C:
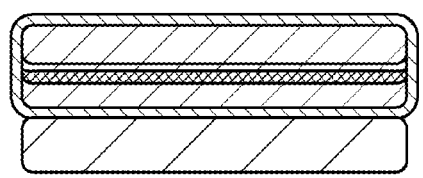
Figure 16D:
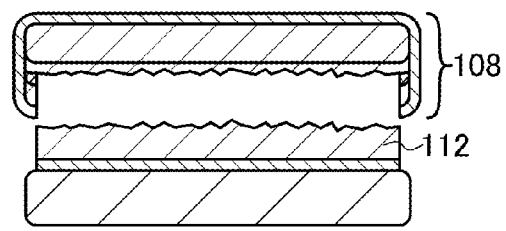

Next, the base substrate 110 is prepared (see FIG. 16B), and the oxide film 104 and the base substrate 110 are bonded (see FIG. 16C). Then, thermal treatment is performed to divide the single crystal semiconductor layer along the embrittlement region 106, so that the single crystal semiconductor layer 112 is formed over the base substrate 110 with the oxide film 104 interposed therebetween (see FIG. 16D).

Figure 16F:
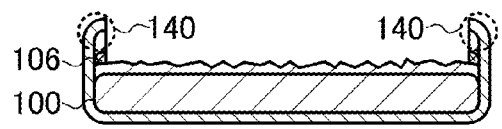
Figure 16E:

After that, the single crystal semiconductor layer 112 is subjected to laser light irradiation treatment and thermal oxidation treatment by using the method described in Embodiment 1 and the like. Accordingly, crystallinity and planarity are recovered, and the single crystal semiconductor layer 112 with reduced concentration of impurities can be obtained (see FIG. 16E).

The steps illustrated in FIGS. 16A to 16E are similar to those described in Embodiment 1; thus, detailed description is omitted here.

Next, a step of utilizing a single crystal semiconductor substrate 108 which has been separated, repeatedly (a reprocessing step of a semiconductor substrate) is described.

Through the above steps, due to edge roll-off effect, the single crystal semiconductor layer 102 and the base substrate 110 are not sufficiently bonded in the edge portion of the single crystal semiconductor substrate 100 in some cases. As a result, the oxide film which is not separated or the like is left as a residue 140 on the single crystal semiconductor substrate 108 (see FIG. 16F).

Figure 16G:
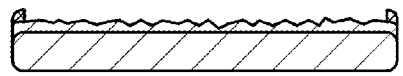

In this embodiment, first, the residue 140 at the edge portion of the single crystal semiconductor substrate 108 is removed (see FIG. 16G). The oxide film 104 in residue 140 can be removed by performing wet etching. Specifically, wet etching is performed using, for example, a mixed solution containing hydrofluoric acid, ammonium fluoride, and a surface active agent (e.g., manufactured by Stella Chemifa Corporation, product name: LAL 500) as an etchant.

The embrittlement region 106 to which hydrogen ions are introduced and the single crystal semiconductor layer 102 can be removed by performing wet etching using an organic alkaline solution typified by TMAH (tetramethylammonium hydroxide). By performing such treatment, a step caused by the residue 140 at the edge portion of the single crystal semiconductor substrate 108 or the like is reduced.

Figure 16H:
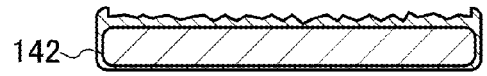

Next, the single crystal semiconductor substrate 108 is subjected to thermal oxidation to form an oxide film 142 (see FIG. 16H), and then, the oxide film 142 is removed. It is more preferable that the thermal oxidation be performed in an atmosphere to which halogen is added. By removal of the oxide film 142 formed in such a manner, impurities in the single crystal semiconductor substrate can be removed. In other words, by action of a halogen element, impurities such as metal turn into volatile chloride and moves into the air to be removed. Further, part of the impurities is fixed in the oxide film 142, and then, removed.

Figure 16I:
Figure 17A:
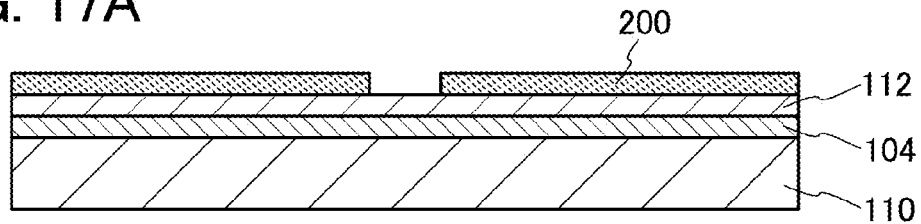
FIGS. 17A to 17E illustrate an example of a method for manufacturing a semiconductor element (a semiconductor device) using an SOI substrate according to an embodiment of the present invention.
Figure 17B:
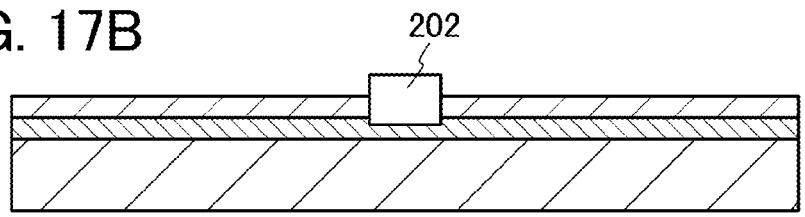
Figure 17C:
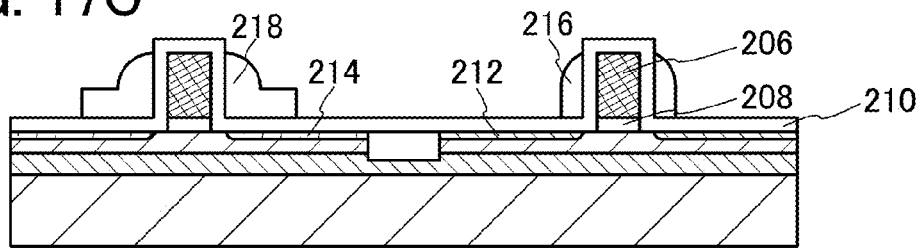
Figure 17D:
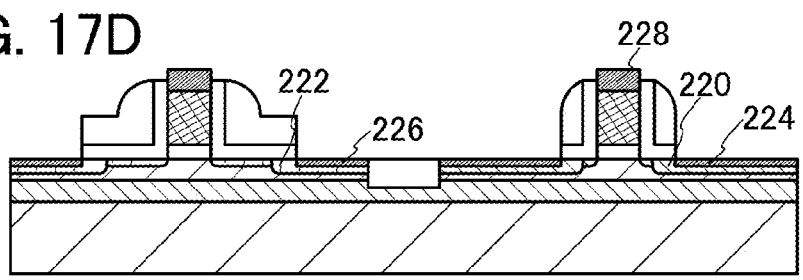
Figure 17E:
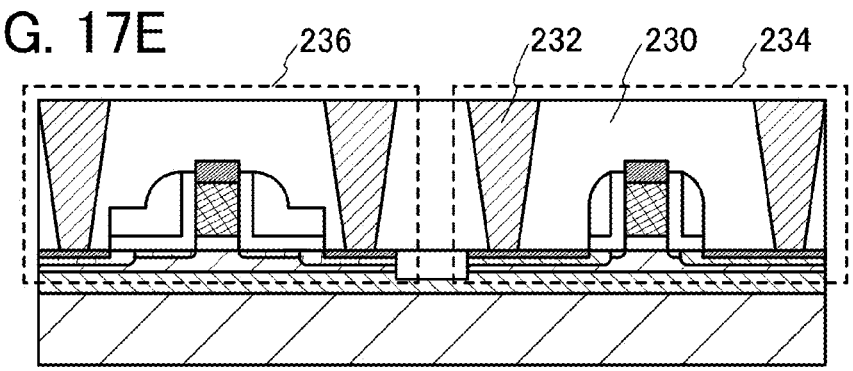

After that, planarization treatment is performed on the singe crystal semiconductor substrate. As the planarization treatment, any one of CMP, laser light irradiation treatment, a dry etching process, or a wet etching process or a combination thereof may be used. As a result of the planarization treatment, the step at the edge portion of the single crystal semiconductor substrate 108 is removed, and planarity of the surface of the single crystal semiconductor substrate 108 is improved, so that a single crystal semiconductor substrate 150 can be obtained (see FIG. 16I). Further, by the planarization treatment, crystal defects on the surface can be reduced.

The thus obtained single crystal semiconductor substrate 150 has high crystallinity and planarity and fewer crystal defects; thus, it is suitable for reusing. The crystal semiconductor substrate is reprocessed and used repeatedly by using the above method, whereby cost due to the single crystal semiconductor substrate can be reduced. With the method described in this embodiment, the reprocessed surface of the single crystal semiconductor substrate can be sufficiently planarized; therefore, adhesion between the single crystal semiconductor substrate and the base substrate is increased, and the bonding defect can be reduced.

Note that this embodiment can be used in combination with Embodiment 1.

Embodiment 3

In this embodiment, a method for manufacturing a semiconductor element using an SOI substrate of the present invention will be described with reference to FIGS. 17A to 17E. In particular, a case of manufacturing an n-channel FET and a p-channel FET which are used for a CMOS structure will be described here. However, a semiconductor element using an SOI substrate of the present invention is not particularly limited thereto. Note that, in FIGS. 17A to 17E, the parts similar to those of FIGS. 1A to 1H are denoted by the same reference numerals as those of FIGS. 1A to 1H, and are not described particularly.

First, after an SOI substrate is obtained in accordance with Embodiment 1 or the like, a protective layer 200 that serves as a mask for formation of an element isolation insulating layer is formed over the single crystal semiconductor layer 112. A process cross-sectional view in this step corresponds to FIG. 17A. A silicon oxide film, a silicon nitride film, or the like is used as the protective layer 200.

Note that the thickness of the single crystal semiconductor layer 112 is preferably equal to or less than 100 nm. With use of such a thin single crystal semiconductor layer, a fully-depleted transistor can be formed. In other words, switching characteristics are improved and power consumption can be reduced. In the case of employing a CMOS structure, operation with extremely high frequency can be realized.

In order to control the threshold voltage, a p-type impurity such as boron, aluminum, or gallium may be added to the single crystal semiconductor layer 112 in advance. For example, as a p-type impurity, boron can be added at a concentration of from $5 \times 10^{17}$ to $1 \times 10^{18}$ cm$^{-3}$.

Next, etching is performed using the protective layer 200 as a mask to remove exposed part of the single crystal semiconductor layer 112 and part of the oxide film 104 therebelow. After that, an insulating film is deposited. The insulating film can be a silicon oxide film, for example. In this case, the insulating film may be formed by using any of a variety of film deposition techniques typified by a chemical vapor deposition method. The insulating film is deposited thickly so as to be embedded in the single crystal semiconductor layer 112.

Then, part of the insulating film, which overlaps with the single crystal semiconductor layer 112, is removed by polishing or the like. The protective layer 200 is removed, thereby an element isolation insulating layer 202 formed of part of the insulating film is left. This step is illustrated in a process cross-sectional view of FIG. 17B.

Next, a first insulating film is formed, and a gate electrode 206 formed using a polysilicon film including an impurity element imparting one conductivity type is formed thereover. Then, the first insulating film is etched using the gate electrode as a mask to form a gate insulating layer 208. The gate insulating layer 208 can be formed by a PECVD method, a sputtering method, or the like. It is preferable that the gate insulating layer 208 be formed using silicon oxide, silicon nitride oxide, silicon nitride, hafnium oxide, aluminum oxide, tantalum oxide, or the like. Note that the gate insulating layer 208 may have a single-layer structure or a layered structure. Here, a silicon oxide film with a thickness of about 20 nm which covers a surface of the single crystal semiconductor layer 112 with a single-layer structure is formed by a PECVD method.

As another formation method of the gate insulating layer 208, the surface of the single crystal semiconductor layer 112 may be oxidized or nitrided by high-density plasma treatment. The high-density plasma treatment can be performed using, for example, a mixed gas of a rare gas such as He, Ar, Kr, or Xe, and a gas such as oxygen, nitrogen, hydrogen, nitrogen oxide, or ammonia. When excitation of the plasma in this case is performed by using a microwave, plasma with a low electron temperature and high density can be generated. The surface of the single crystal semiconductor layer 112 is oxidized or nitrided with oxygen radical (including an OH radical) or a nitrogen radical (including an NH radical) in plasma, whereby an insulating film with a thickness of from 1 to 50 nm (preferably, from 5 to 30 nm) can be formed over the surface of the single crystal semiconductor layer 112.

In the present invention, since the planarization treatment is performed on the single crystal semiconductor layer, sufficient gate withstand voltage can be obtained even when an insulating film with a thickness of about 20 nm is used as the gate insulating layer 208.

Next, a second insulating film 210 with which the gate electrode 206 is covered is formed. Then, phosphorus (P), arsenic (As), or the like is added to a region which serves as an n-channel FET later to form a first impurity region 212, and boron (B) or the like is added to a region which serves as a p-channel FET later to form a second impurity region 214. Although the impurity regions are formed after formation of the second insulating film 210 in this case, the impurity regions may be formed before the second insulating film 210 is formed. In this case, the impurity regions whose shapes are determined by thermal treatment performed later have slightly different shapes.

After that, sidewall insulating layers 216 and 218 are formed. The sidewall insulating layer 218 of a region which serves as the p-channel FET may be larger in width than the sidewall insulating layer 216 of a region which serves as the n-channel FET. This step is illustrated in a process cross-sectional view of FIG. 17C.

Next, the second insulating film 210 is partly etched to expose a top surface of the gate electrode 206, part of a surface of the first impurity region 212, and part of a surface of the second impurity region 214. Then, phosphorus (P), arsenic (As), or the like is added to a region which serves as the n-channel FET to form a third impurity region 220, and boron (B) or the like is added to a region which serves as the p-channel FET to form a fourth impurity region 222. Although the impurity regions are formed after the second insulating film 210 is partly etched in this case, the impurity regions may be formed before the second insulating film 210 is etched.

Then, thermal treatment (preferably at a temperature of from 800 to 1100° C.) for activation is performed, whereby the impurities added to the impurity regions slightly diffuse, and each shape of the impurity regions is determined.

Next, a metal film (e.g., a cobalt film) for formation of silicide is formed, and thermal treatment (at temperature of 500° C. for one minute, for example) such as RTA is performed, whereby silicon at a portion in contact with the cobalt film turns into silicide, so that silicide 224, silicide 226, and silicide 228 are formed. Then, the cobalt film is selectively removed, and thermal treatment is performed at a higher temperature than that of the thermal treatment for silicide to lower resistance of the silicide portions. This step is illustrated in a process cross-sectional view of FIG. 17D.

Next, an interlayer insulating film 230 is formed and contact plugs 232 that reach the silicide 224 and silicide 226 are formed therein. Through the above steps, an n-channel FET 234 and a p-channel FET 236 can be manufactured using the single crystal semiconductor layer 112 formed over the base substrate 110. This step is illustrated in a process cross-sectional view of FIG. 17E.

The n-channel FET 234 and the p-channel FET 236 are complementarily combined to form a CMOS structure. Further, a variety of semiconductor devices can be manufactured by using such a semiconductor element.

This embodiment can be used in combination with Embodiment 1 or 2 as appropriate.

Embodiment 4

In this embodiment, another example of a method for manufacturing a semiconductor element using an SOI substrate of the present invention will be described. A semiconductor element (a thin film transistor) described in this embodiment has a feature that an opening for connecting a semiconductor layer and a wiring is formed in a self-aligned manner.

First, an SOI substrate manufactured by using the method described in Embodiment 1 or the like is prepared (not illustrated). A semiconductor layer of the SOI substrate is patterned to form an island-shaped semiconductor layer 306, and then an insulating layer 308 serving as a gate insulating layer and a conductive layer serving as a gate electrode (or a wiring) are sequentially formed. In this embodiment, the conductive layer serving as a gate electrode is formed to have two-layer structure; however, the present invention is not limited thereto. Here, the insulating layer 308 can be formed using a material such as silicon oxide, silicon oxynitride, silicon nitride oxide, or silicon nitride by a CVD method, a sputtering method, or the like. The insulating layer 308 may have a thickness of from about 5 to 100 nm. The conductive layer can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The conductive layer may have a thickness of from about 100 to 500 nm. Note that in this embodiment, the insulating layer 308 is formed using silicon oxide (with a thickness of 20 nm), the conductive layer (lower layer) is formed using tantalum nitride (with a thickness of 50 nm), and the conductive layer (upper layer) is formed using tungsten (with a thickness of 200 nm).

An impurity imparting p-type conductivity such as boron, aluminum, or gallium or an impurity imparting n-type conductivity such as phosphorus or arsenic may be added to the semiconductor layer in order to control the threshold voltage of a thins film transistor. For example, in the case of adding boron as an impurity imparting p-type conductivity, boron may be added at a concentration of from $5\times10^{16}$ to $1\times10^{17}$ $cm^{-3}$. Further, the semiconductor layer may be subjected to hydrogenation treatment. The hydrogenation treatment is performed for example, at 350° C. in a hydrogen atmosphere for approximately two hours.

Next, the conductive layer serving as the gate electrode is patterned. Note that in the manufacturing method of a thin film transistor in this embodiment, patterning is performed at least twice on the conductive layer. Here, first patterning of the two patterning is performed, whereby a conductive layer 310 and a conductive layer 312, which are larger than a gate electrode formed in final form, are formed. Here, the size which is "larger" herein means the size with which a resist mask used in a second patterning for formation of the gate electrode can be formed in accordance with positions of the conductive layer 310 and the conductive layer 312. Note that the both first patterning and second patterning may be performed on a region of the conductive layer, which overlaps with the island-shaped semiconductor layer 306; that is, it is not necessary that an entire surface of the conductive layer be subjected to patterning twice.

Figure 18A:
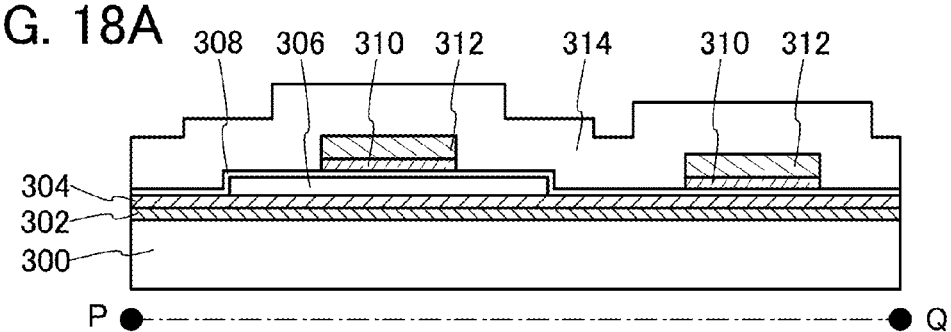
FIGS. 18A to 18D illustrate an example of a method for manufacturing a semiconductor element (a semiconductor device) using an SOI substrate according to an embodiment of the present invention.
Figure 20A:
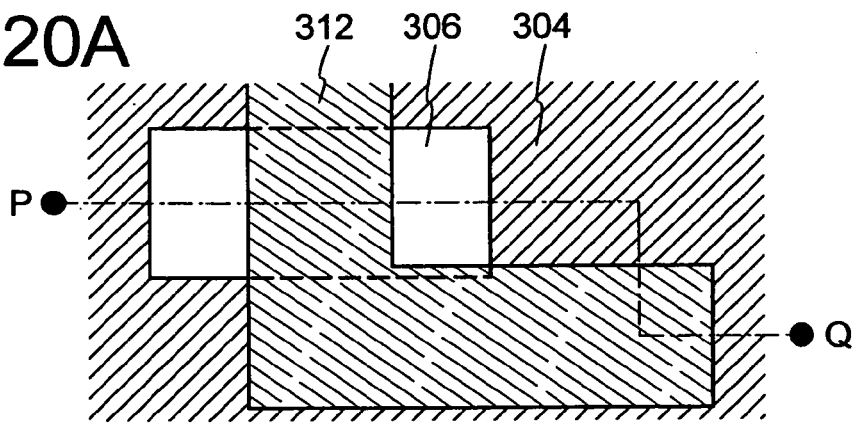
FIGS. 20A to 20D illustrate the example of the method for manufacturing the semiconductor element (the semiconductor device) using the SOI substrate according to the embodiment of the present invention.

After that, an insulating layer 314 is formed to cover the insulating layer 308, the conductive layer 310, and the conductive layer 312 (see FIG. 18A and FIG. 20A). Here, the insulating layer 314 can be formed using a material such as silicon oxide, silicon oxynitride, silicon nitride oxide, silicon nitride, hafnium oxide, or aluminum oxide by a CVD method, a sputtering method, or the like. It is preferable that the thickness of the insulating layer 314 be from about 0.5 to 2 μm. In this embodiment, the insulating layer 314 is formed using silicon oxide (with a thickness of 1 μm) as an example. Note that this embodiment is described using an SOI substrate having a structure in which an insulating layer 302, an insulating layer 304, and the semiconductor layer are sequentially formed over a base substrate 300; however, the present invention is not construed as being limited thereto.

Figure 18B:
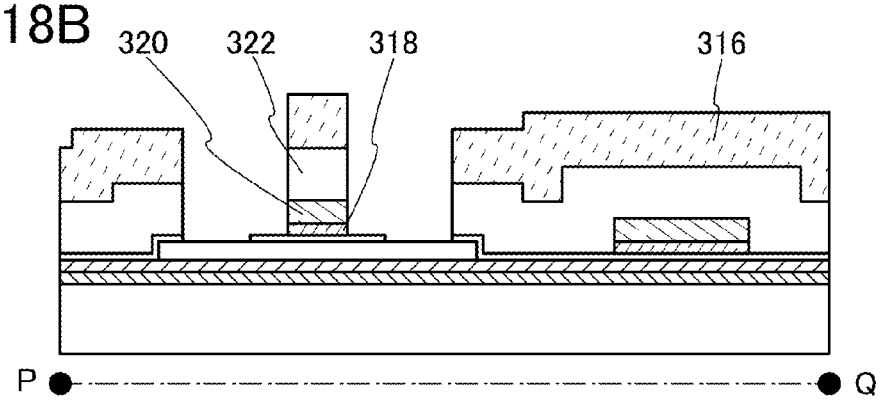

Note that FIG. 18A is a cross-sectional view taken along a line P-Q of FIG. 20A that is a plan view. Similarly, FIG. 18B corresponds to FIG. 20B, FIG. 18D corresponds to FIG. 20C, and FIG. 19C corresponds to FIG. 20D. In the plan views of FIGS. 20A to 20D, components which are illustrated in the cross-sectional views are partly omitted for simplicity.

Next, a resist mask 316 for formation of the gate electrode, which is used in patterning, is formed over the insulating layer 314. This patterning corresponds to the second patterning of the patterning steps performed twice with respect to the conductive layer. The resist mask 316 can be formed in such a manner that a resist material that is a photosensitive material is applied and exposed to light to form a pattern. After the resist mask 316 is formed, the conductive layer 310, the conductive layer 312, and the insulating layer 314 are patterned with use of the resist mask 316. Specifically, after the insulating layer 314 is selectively etched to form an insulating layer 322, the conductive layer 310 and the conductive layer 312 are selectively etched, so that a conductive layer 318 and a conductive layer 320 serving as a gate electrode are formed (see FIG. 18B and FIG. 20B). Here, when the insulating layer 314 is selectively etched, the insulating layer 308 serving as the gate insulating layer is partly etched at the same time.

Then, the resist mask 316 is removed. After that, an insulating layer 324 is formed to cover the island-shaped semiconductor layer 306, the insulating layer 308, the conductive layer 318, the conductive layer 320, the insulating layer 322, and the like. The insulating layer 324 serves as a barrier layer in a later formation step of sidewalls. The insulating layer 324 can be formed using a material such as silicon oxide, silicon oxynitride, silicon nitride oxide, silicon nitride, hafnium oxide, aluminum oxide, or tantalum oxide. In order to make the insulating layer 324 serve as a barrier layer, it is preferable that a material having selection ratio of etching with respect to that of a material used for the sidewalls in a later step be used for the insulating layer 324. The insulating layer 324 may have a thickness of about 10 to 200 nm. In this embodiment, the insulating layer 324 is formed using silicon nitride (with a thickness of 50 nm).

Figure 18C:
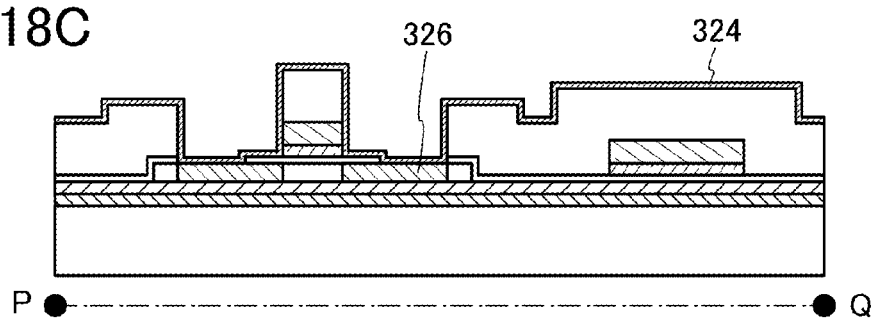

After the insulating layer 324 is formed, an impurity element imparting one conductivity type is added to the island-shaped semiconductor layer 306 with use of the conductive layer 318, the conductive layer 320, the insulating layer 322, and the like as masks. In this embodiment, an n-type impurity element (e.g., phosphorus or arsenic) is added to the island-shaped semiconductor layer 306. By addition of the impurity element, impurity regions 326 are formed in the island-shaped semiconductor layer 306 (see FIG. 18C). Note that the n-type impurity element is added after formation of the insulating layer 324 in this embodiment; however, the present invention is not limited to the above. For example, the impurity element may be added after or before the resist mask is removed, and then the insulating layer 324 may be formed. Alternatively, an impurity element to be added can be a p-type impurity element.

Figure 18D:
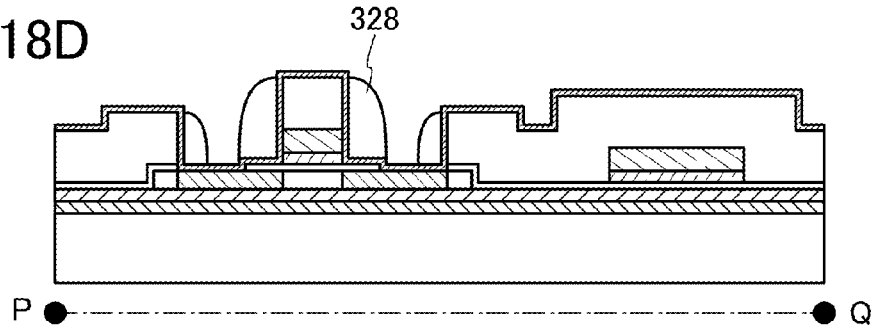
Figure 20B:
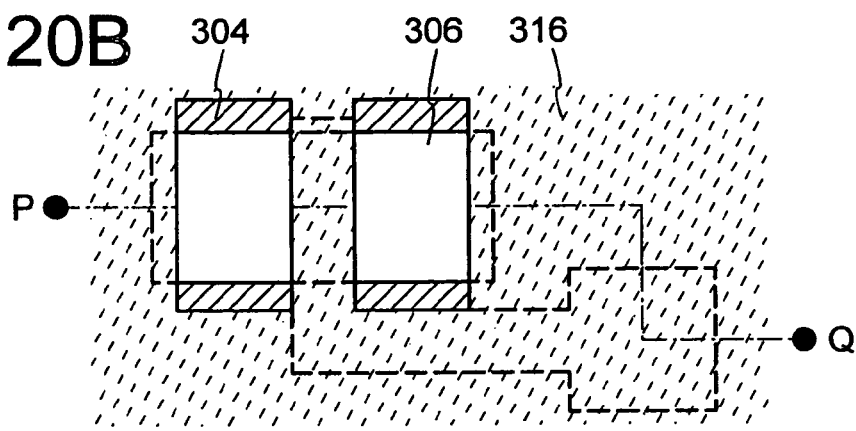
Figure 20C:
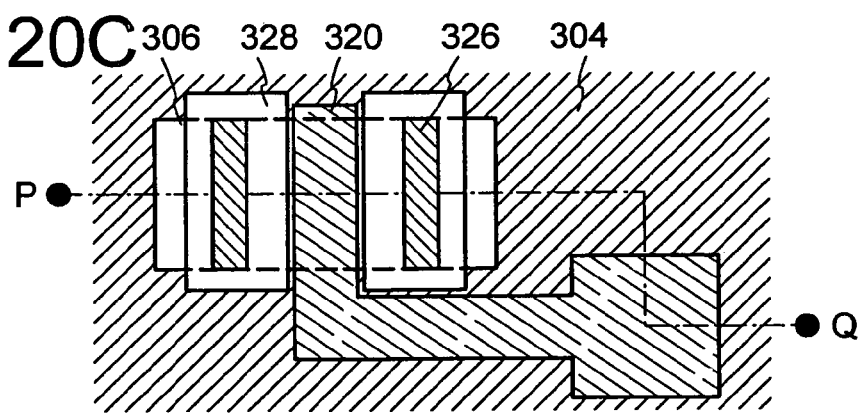

Next, sidewalls 328 are formed (see FIG. 18D and FIG. 20C). For formation of the sidewalls 328, an insulating layer is formed to cover the insulating layer 324, and then anisotropic etching mainly in a perpendicular direction is performed on the insulating layer. This is because the insulating layer is selectively etched by the anisotropic etching. The insulating layer can be formed using a material such as silicon oxide, silicon oxynitride, silicon nitride oxide, silicon nitride, hafnium oxide, aluminum oxide, or tantalum oxide by a CVD method, a sputtering method, or the like. Further, a layer including an organic material may be formed by a spin coating method or the like. In this embodiment, silicon oxide is used as a material of the insulating material. In other words, the sidewalls 328 are formed using silicon oxide. In addition, as an etching gas, a mixed gas of $CHF_3$ and helium can be used. Note that the step of forming the sidewalls 328 is not limited to the above.

Next, an impurity element imparting one conductivity type is added to the island-shaped semiconductor layer 306 with use of the insulating layer 322, the sidewalls 328, and the like as masks. Note that the impurity element added to the island-shaped semiconductor layer 306 at this time has the same conductivity type as the impurity element which has been added in the previous step and is added at higher concentration than that of the impurity element in the previous step. In other words, an n-type impurity element is added in this embodiment.

A channel formation region 330, low-concentration impurity regions 332, and high-concentration impurity regions 334 are formed in the island-shaped semiconductor layer 306 by addition of the impurity element. The low-concentration impurity regions 332 each serve as an LDD (Lightly Doped Drain) region and the high-concentration impurity regions 334 each serve as a source or a drain.

Figure 19A:
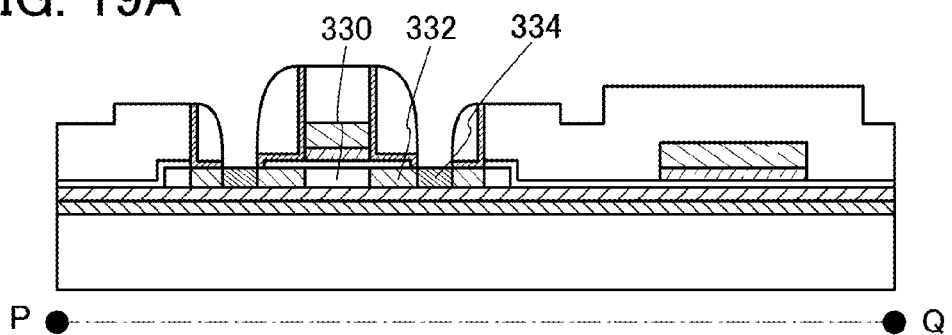
FIGS. 19A to 19C illustrate the example of the method for manufacturing the semiconductor element (the semiconductor device) using the SOI substrate according to the embodiment of the present invention.

Next, the insulating layer 324 is etched to form openings (contact holes) reaching the high-concentration impurity regions (see FIG. 19A). In this embodiment, since the insulating layer 322 and the sidewalls 328 are formed using silicon oxide and the insulating layer 324 is formed using silicon nitride, the insulating layer 324 can be etched selectively to form the openings.

Figure 19B:
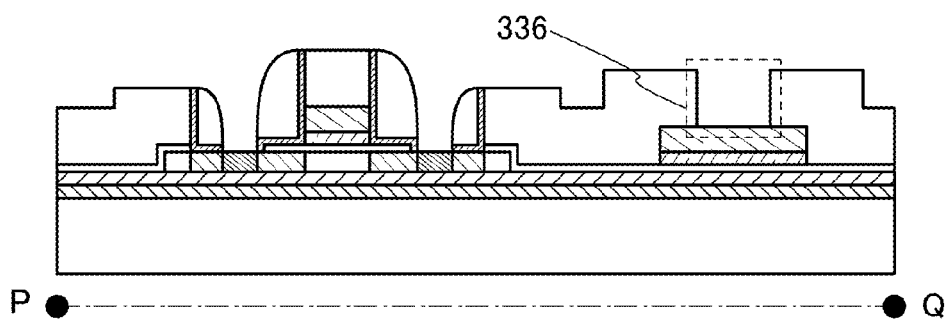

After the openings reaching the high-concentration impurity regions are formed, the insulating layer 314 is selectively etched, whereby an opening 336 is formed (see FIG. 19B). The opening 336 is formed larger than each of the openings reaching the high-concentration impurity regions. This is because the minimum line width of the opening 336 is determined in accordance with the process rule or the design rule, whereas the openings reaching the high-concentration impurity regions are formed in a self-aligned manner, thereby being miniaturized.

After that, a conductive layer is formed, which is in contact with the high-concentration impurity regions 334 of the island-shaped semiconductor layer 306 and the conductive layer 320 through the openings reaching the high-concentration impurity regions and the opening 336. The conductive layer can be formed by a CVD method, a sputtering method, or the like. A material such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si) can be used. Moreover, an alloy containing the aforementioned metal as the main component or a compound containing the aforementioned metal may be used. The conductive layer may have a single-layer structure or a layered structure. In this embodiment, the conductive layer has a three-layer structure of titanium, aluminum, and titanium.

Figure 19C:
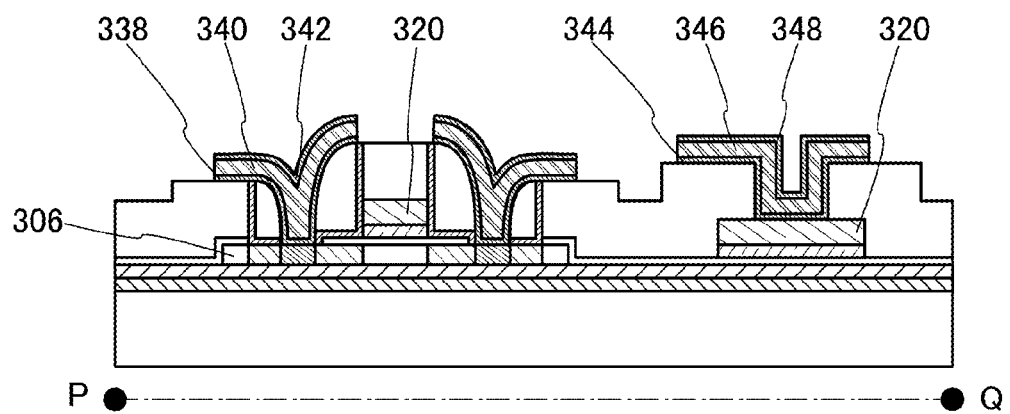
Figure 20D:
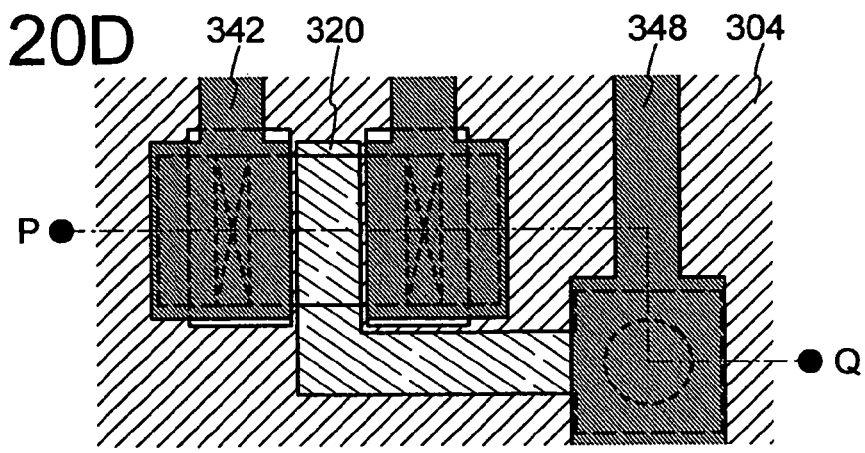

The conductive layer is etched selectively to form a stacked layer of a conductive layer 338, a conductive layer 340, and a conductive layer 342, which serves as a source or drain electrode (a source or drain wiring) and a stacked layer of a conductive layer 344, a conductive layer 346, and a conductive layer 348, which is connected to the conductive layer 320 and serves as a wiring (see FIG. 19C and FIG. 20D). Through the process, a thin film transistor is completed, in which the island-shaped semiconductor layer 306 and the conductive layer serving as the source or drain electrode are connected in a self-aligned manner.

In accordance with the method described in this embodiment, connection of the source or drain electrode can be formed in a self-aligned manner; therefore, a structure of the transistor can be miniaturized. That is, the degree of integration of semiconductor elements can be improved. Since the length of low-concentration impurity region can be determined in a self-aligned manner, variation in resistance that is to be a problem in miniaturization can be suppressed. In other words, the transistor with excellent characteristics can be provided.

This embodiment can be used in combination with Embodiments 1 to 3 as appropriate.

Embodiment 5

Figure 21A:
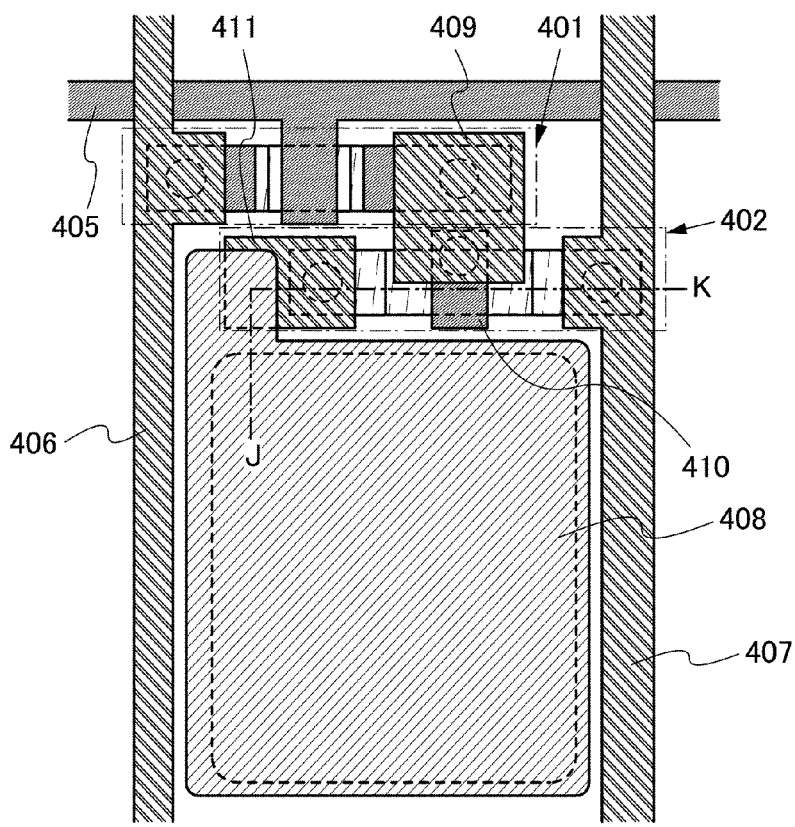
FIGS. 21A and 21B illustrate an example of an EL display device using an SOI substrate according to an embodiment of the present invention.
Figure 21B:
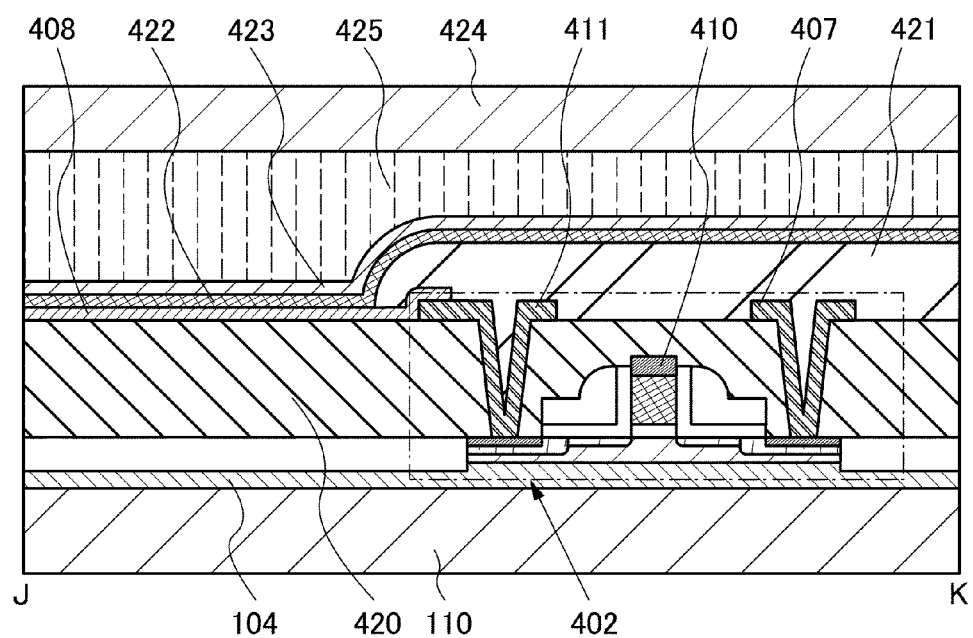

In this embodiment, an electroluminescence display device (hereinafter, referred to as an EL display device) using an SOI substrate of the present invention will be described with reference to FIGS. 21A and 21B. FIG. 21A is a plan view of a pixel in an EL display device, and FIG. 21B is a cross-sectional view taken along a line J-K in FIG. 21A. Note that a semiconductor substrate generally blocks visible light; therefore, in the case of using a semiconductor substrate as a base substrate, light is emitted on the upper side. That is, a so-called top-emission EL display device is obtained.

As illustrated in FIG. 21A, each pixel includes a selection transistor 401, a display control transistor 402, a scanning line 405, a signal line 406, a current supply line 407, and a pixel electrode 408. Each pixel is provided with a light-emitting element having a structure in which a layer including an electroluminescent material (an EL layer) is sandwiched between a pair of electrodes. One electrode of the light-emitting element is the pixel electrode 408. Each active layer of the selection transistor 401 and the display control transistor 402 is formed using a single crystal semiconductor film provided over a base substrate 110.

In the selection transistor 401, a gate electrode is included in the scanning line 405, one of a source electrode and a drain electrode is included in the signal line 406, and the other thereof is formed as an electrode 409. In the display control transistor 402, a gate electrode 410 is electrically connected to the electrode 409, one of a source electrode and a drain electrode is formed as an electrode 411 which is electrically connected to the pixel electrode 408, and the other thereof is included in the current supply line 407.

The display control transistor 402 is a p-channel FET. The detail of the p-channel FET is similar to the p-channel FET 236 described in Embodiment 3; thus, specific description is omitted here. Although the p-channel FET is used as the display control transistor in this embodiment, the display control transistor is not limited thereto and an n-channel FET may be used. Similarly, the selection transistor may be any of an n-channel FET or a p-channel FET.

An interlayer insulating film 420 is formed covering the gate electrode 410 of the display control transistor 402 and the like. Over the interlayer insulating film 420, the current supply line 407, the pixel electrode 408, the electrode 411, and the like are formed. Here, the pixel electrode 408 is electrically connected to the electrode 411. A peripheral portion of the pixel electrode 408 is surrounded by a partition layer 421 having an insulating property. An EL layer 422 is formed over the pixel electrode 408, and a counter electrode 423 is formed over the EL layer 422. A counter substrate 424 is provided as a reinforcing plate, and the counter substrate 424 is fixed to the base substrate 110 with a resin layer 425.

The grayscale of the EL display device is controlled by a current drive method by which the luminance of the light-emitting element is controlled by the amount of current and a voltage drive method by which the luminance is controlled by the amount of voltage. The current drive method is difficult to be employed when the transistor has large variation in characteristics. In the present invention, an SOI substrate is manufactured by a method including epitaxial growth, thermal oxidation, laser irradiation, and the like, whereby variation in characteristics of a transistor manufactured using the SOI substrate can be significantly reduced. In other words, an EL display device is manufactured using the SOI substrate of the present invention, whereby it becomes possible to employ the current drive method.

Further, the transistor manufactured using the SOI substrate of the present invention has excellent characteristics, so that it is suitable for formation of a driver circuit of the EL display device. That is, with use of the SOI substrate of the present invention, a monolithic EL display device can be manufactured.

This embodiment can be used in combination with Embodiment 1 to 4 as appropriate.

Embodiment 6

A semiconductor device such as a transistor is manufactured using an SOI substrate of the present invention, and a variety of electronic appliances can be manufactured using the semiconductor device. A single crystal semiconductor layer provided for the SOI substrate of the present invention has low impurity concentration, fewer crystal defects, and high surface planarity. Therefore, a semiconductor element using the single crystal semiconductor layer as an active layer has high electric characteristics. With use of such a semiconductor element having high electric characteristics, excellent electronic appliances can be provided. In this embodiment, specific examples of electronic appliances will be described with reference to drawings.

Figure 22A:
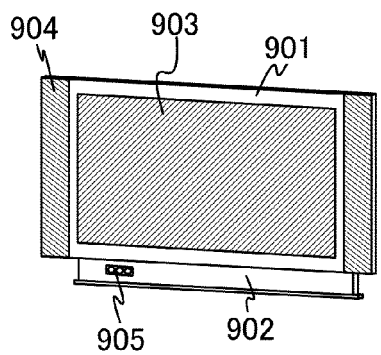
FIGS. 22A to 22F each illustrate an example of an electronic appliance using an SOI substrate according to an embodiment of the present invention.

FIG. 22A illustrates a display device including a chassis 901, a supporting base 902, a display portion 903, a speaker portion 904, a video input terminal 905, and the like. The display device is manufactured using the semiconductor element (such as a transistor) described in another embodiment for a driver IC, the display portion 903, or the like. The display device includes a liquid crystal display device, a light-emitting display device, and the like, and further includes all the information display devices for computers, television reception, advertisement display, and the like. Specifically, a display, a head mount display, a reflection type projector, and the like are given.

Figure 22B:
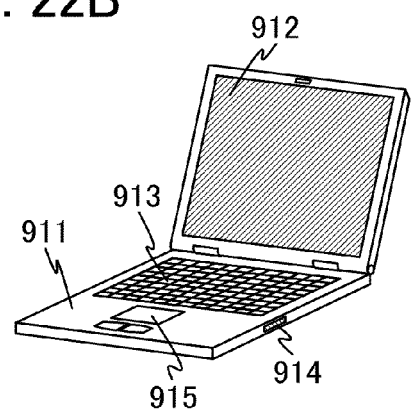

FIG. 22B illustrates a computer including a chassis 911, a display portion 912, a keyboard 913, an external connection port 914, a pointing device 915, and the like. A semiconductor element formed in accordance with the present invention can be applied not only to a pixel portion in the display portion 912 but also to a driver IC for display, a CPU inside a main body, a memory, and the like.

Figure 22C:
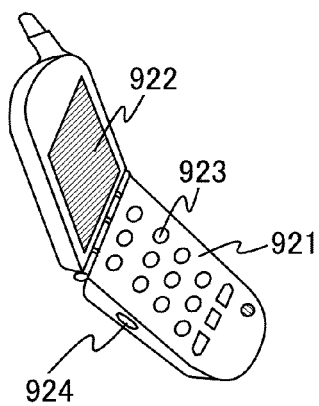

FIG. 22C illustrates a mobile phone which is a typical example of mobile information processing terminals. This mobile phone includes a chassis 921, a display portion 922, an operation key 923, and the like. A semiconductor element manufactured in accordance with the present invention can be applied not only to a pixel portion in the display portion 922 or a sensor portion 924 but also to a driver IC for display, a memory, an audio processing circuit, and the like. The sensor portion 924 includes an optical sensor element, by which the brightness of the display portion 922 can be controlled according to the illuminance of the sensor portion 924, and by which the illumination brightness of the operation key 923 can be controlled according to the illuminance of the sensor portion 924. Thus, the power consumption of the mobile phone can be suppressed by utilizing illuminance obtained by an optical sensor.

The SOI substrate manufactured in accordance with the present invention can be used for electronic appliances such as PDA (Personal Digital Assistants), digital cameras, small gaming machines, mobile audio reproducing devices, and the like as well as the mobile phone. For example, it is possible to form a functional circuit such as a CPU, a memory, or a sensor and to apply the SOI substrate to pixel portions of these electronic appliances and a driver IC for display.

Figure 22D:
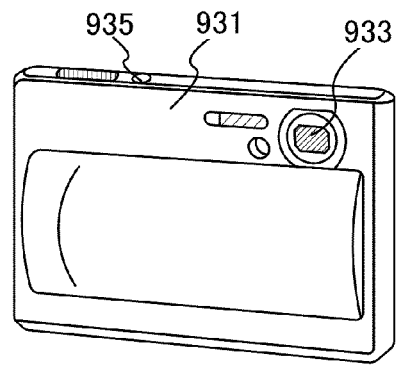
Figure 22E:
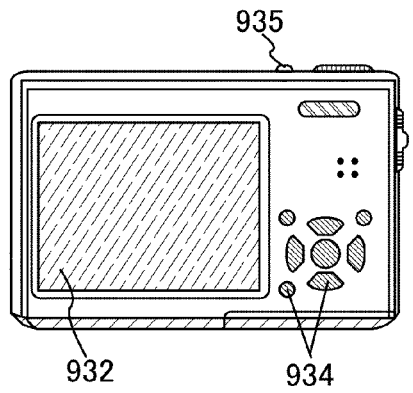

FIGS. 22D and 22E illustrate a digital camera. Note that FIG. 22E illustrates a rear side of FIG. 22D. The digital camera includes a chassis 931, a display portion 932, a lens 933, operation buttons 934, a shutter button 935, and the like. A semiconductor element formed in accordance with the present invention can be used for a pixel portion of the display portion 932, a driver IC for driving the display portion 932, a memory, a light-receiving element, or the like.

Figure 22F:
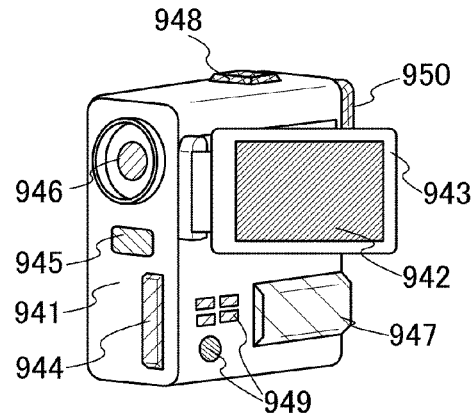

FIG. 22F illustrates a digital video camera. The digital video camera includes a main body 941, a display portion 942, a chassis 943, an external connection port 944, a remote control receive section 945, an image receiving portion 946, a battery 947, an audio input portion 948, an operation key 949, an eye piece portion 950, and the like. A semiconductor element formed in accordance with the present invention can be used for a pixel portion of the display portion 942, a driver IC for controlling the display portion 942, a memory, a digital input processor, a light-receiving element, or the like.

Besides, the present invention can be applied to, for example, a navigation system, a sound reproducing device, an image reproducing device equipped with a recording medium, and the like. Transistors formed in accordance with the present invention can be applied to pixel portions of display portions of these display devices, driver ICs for controlling the display portions, memories, digital input processing devices, sensor portions, and the like.

Figure 23A:
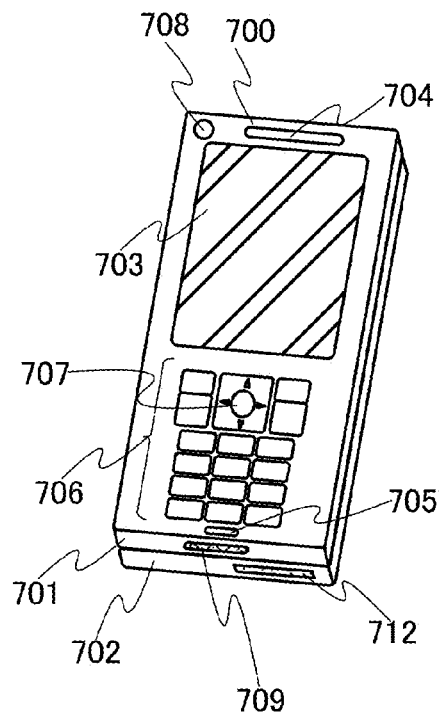
FIGS. 23A to 23C illustrate an example of an electronic appliance using an SOI substrate according to an embodiment of the present invention.
Figure 23B:
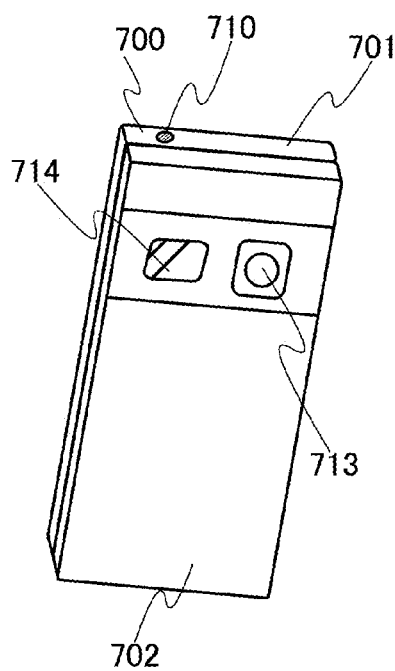
Figure 23C:
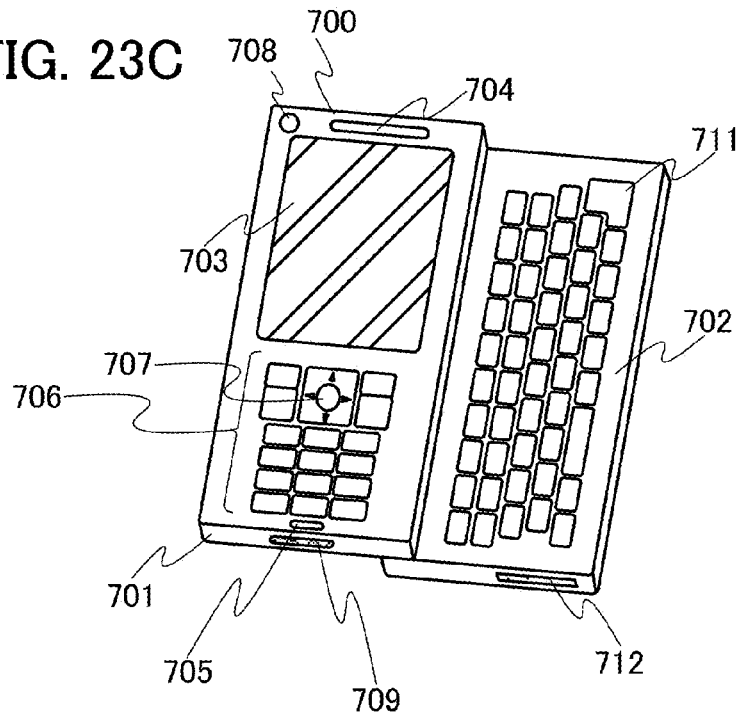

FIGS. 23A to 23C illustrate another example of a mobile phone to which the present invention is applied. Here, FIG. 23A is a front view, FIG. 23B is a rear view, and FIG. 23C is a front view in which two chassis are slid. A mobile phone 700 is a so-called smartphone which has both functions of a cellular phone and a portable information terminal, and incorporates a computer and can process a variety of data processing in addition to voice calls.

The mobile phone 700 has chassis 701 and 702. The chassis 701 includes a display portion 703, a speaker 704, a microphone 705, operation keys 706, a pointing device 707, a front camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element formed in accordance with the present invention can be used for a pixel portion of the display portion 703, a driver IC for driving the display portion 703, a memory, an audio processing circuit, or the like. The EL display device illustrated in FIGS. 21A and 21B is applied to the display portion 703, whereby the display portion can have excellent image quality with little display unevenness.

Further, in addition to the above structure, the mobile phone 700 may incorporate a non-contact IC chip, a small memory device, or the like.

The chassis 701 and 702 which overlap with each other (see FIG. 23A) can be slid, and are developed by being slid as illustrated in FIG. 23C. Since the front camera lens 708 is provided in the same plane as the display portion 703, the mobile phone 700 can be used as a videophone. Further, a still image and a moving image can be taken with the rear camera 713 and the light 714, using the display portion 703 as a viewfinder.

With use of the speaker 704 and the microphone 705, the mobile phone 700 can be used as an audio recording device (recording device) or an audio reproducing device. With use of the operation keys 706, further, operations of incoming and outgoing of calls, simple information input such as electronic mail, scrolling of a screen, cursor movement, e.g., for selecting information to be displayed in the display portion, and the like are possible.

If much information needs to be treated in documentation, a use as a portable information terminal, and the like, it is convenient to use the keyboard 711. By sliding the chassis 701 and 702 which overlap with each other (see FIG. 23A), the chassis 701 and 702 can be developed as illustrated in FIG. 23C. In using the mobile phone 700 as a portable information terminal, a cursor can be moved smoothly with use of the keyboard 711 and the pointing device 707. The external connection terminal 709 can be connected to an AC adaptor and various types of cables such as a USB cable, and charging and data communication with a personal computer or the like are possible. Further, by inserting a recording medium in the external memory slot 712, a larger amount of data can be stored and moved.

The rear face of the chassis 702 (see FIG. 23B) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above functions and structures.

As described above, the application range of a semiconductor device manufactured in accordance with the present invention is extremely broad, and the SOI substrate of the present invention can be used for electronic appliances of every field. This embodiment can be used in combination with Embodiments 1 to 5 as appropriate.

This application is based on Japanese Patent Application serial no. 2008-079592 filed with Japan Patent Office on Mar. 26, 2008, the entire contents of which are hereby incorporated by reference.

What is claimed is:

1. A method for manufacturing an SOI substrate comprising the steps of:
   forming a single crystal semiconductor layer by an epitaxial growth method over a surface of a single crystal semiconductor substrate;
   performing first thermal oxidation treatment on the single crystal semiconductor layer to form a first oxide film on the single crystal semiconductor layer;
   irradiating a surface of the first oxide film with ions containing $H_3^\pm$, whereby the ions are introduced to the single crystal semiconductor layer;
   bonding the single crystal semiconductor layer and a base substrate with the first oxide film interposed between the single crystal semiconductor layer and the base substrate;
   dividing the single crystal semiconductor layer by performing thermal treatment at a region where the ions are introduced, so that the single crystal semiconductor layer is partly left over the base substrate;
   irradiating the single crystal semiconductor layer left over the base substrate with laser light;
   performing second thermal oxidation treatment on the single crystal semiconductor layer left over the base substrate to form a second oxide film on the single crystal semiconductor layer left over the base substrate; and
   removing the second oxide film.

2. The method for manufacturing the SOI substrate according to claim 1, wherein the first thermal oxidation treatment is performed in an atmosphere containing HCl.

3. The method for manufacturing the SOI substrate according to claim 1, wherein the second thermal oxidation treatment is performed in an atmosphere containing HCl.

4. The method for manufacturing the SOI substrate according to claim 1, wherein planarization treatment is performed on the single crystal semiconductor layer left over the base substrate after the irradiating with the laser light step.

5. The method for manufacturing the SOI substrate according to claim 4, wherein the planarization treatment is a CMP process or an etching process.

6. The method for manufacturing the SOI substrate according to claim 1, wherein the irradiating with the laser light step is performed in an inert atmosphere.

7. A semiconductor device using the SOI substrate manufactured by the manufacturing method described in claim 1.

8. The method for manufacturing the SOI substrate according to claim 1, wherein an upper part of the single crystal semiconductor layer is melted and is in a liquid phase while a lower part of the single crystal semiconductor layer is not melted and is still in a solid phase in the step of irradiating the single crystal semiconductor layer left with laser light.

9. A method for manufacturing an SOI substrate comprising the steps of:
   forming a single crystal semiconductor layer by an epitaxial growth method over a surface of a single crystal semiconductor substrate;
   performing first thermal oxidation treatment on the single crystal semiconductor layer to form a first oxide film on the single crystal semiconductor layer;
   irradiating a surface of the first oxide film with ions containing $H_3^+$, whereby a layer where the ions are introduced is formed in the single crystal semiconductor layer;
   bonding the single crystal semiconductor layer and a base substrate with the first oxide film interposed between the single crystal semiconductor layer and the base substrate;

dividing the single crystal semiconductor layer by performing thermal treatment at the layer, so that the single crystal semiconductor layer is partly left over the base substrate;

irradiating the single crystal semiconductor layer left over the base substrate with laser light;

performing second thermal oxidation treatment on the single crystal semiconductor layer left over the base substrate to form a second oxide film on the single crystal semiconductor layer left over the base substrate; and removing the second oxide film.

10. The method for manufacturing the SOI substrate according to claim 9, wherein the first thermal oxidation treatment is performed in an atmosphere containing HCl.

11. The method for manufacturing the SOI substrate according to claim 9, wherein the second thermal oxidation treatment is performed in an atmosphere containing HCl.

12. The method for manufacturing the SOI substrate according to claim 9, wherein planarization treatment is performed on the single crystal semiconductor layer left over the base substrate after the irradiating with the laser light step.

13. The method for manufacturing the SOI substrate according to claim 12, wherein the planarization treatment is a CMP process or an etching process.

14. The method for manufacturing the SOI substrate according to claim 9, wherein the irradiating with the laser light step is performed in an inert atmosphere.

15. A semiconductor device using the SOI substrate manufactured by the manufacturing method described in claim 9.

16. The method for manufacturing the SOI substrate according to claim 9, wherein an upper part of the single crystal semiconductor layer is melted and is in a liquid phase while a lower part of the single crystal semiconductor layer is not melted and is still in a solid phase in the step of irradiating the single crystal semiconductor layer left with laser light.

17. A method for manufacturing a semiconductor device comprising the steps of:

forming a single crystal semiconductor layer by an epitaxial growth method over a surface of a single crystal semiconductor substrate;

performing first thermal oxidation treatment on the single crystal semiconductor layer to form a first oxide film on the single crystal semiconductor layer;

irradiating a surface of the first oxide film with ions containing $H_3^+$, whereby the ions are introduced to the single crystal semiconductor layer;

bonding the single crystal semiconductor layer and a base substrate with the first oxide film interposed between the single crystal semiconductor layer and the base substrate;

dividing the single crystal semiconductor layer by performing thermal treatment at a region where the ions are introduced, so that the single crystal semiconductor layer is partly left over the base substrate;

irradiating the single crystal semiconductor layer left over the base substrate with laser light;

performing second thermal oxidation treatment on the single crystal semiconductor layer left over the base substrate to form a second oxide film on the single crystal semiconductor layer left over the base substrate;

removing the second oxide film; and forming an island-shaped semiconductor layer using the single crystal semiconductor layer left over the base substrate.

18. The method for manufacturing the semiconductor device according to claim 17, wherein the first thermal oxidation treatment is performed in an atmosphere containing HCl.

19. The method for manufacturing the semiconductor device according to claim 17, wherein the second thermal oxidation treatment is performed in an atmosphere containing HCl.

20. The method for manufacturing the semiconductor device according to claim 17, wherein planarization treatment is performed on the single crystal semiconductor layer left over the base substrate after the irradiating with the laser light step.

21. The method for manufacturing the semiconductor device according to claim 20, wherein the planarization treatment is a CMP process or an etching process.

22. The method for manufacturing the semiconductor device according to claim 17, wherein the irradiating with the laser light step is performed in an inert atmosphere.

23. The method for manufacturing the semiconductor device according to claim 17, wherein the forming the island-shaped semiconductor layer step is performed by patterning.

24. The method for manufacturing the semiconductor device according to claim 17, wherein the forming the island-shaped semiconductor layer step is performed by forming an element isolation insulating layer.

25. The method for manufacturing the semiconductor device according to claim 17, wherein an upper part of the single crystal semiconductor layer is melted and is in a liquid phase while a lower part of the single crystal semiconductor layer is not melted and is still in a solid phase in the step of irradiating the single crystal semiconductor layer left with laser light.

* * * * *